(12) United States Patent
Konno et al.

(10) Patent No.: US 8,159,123 B2
(45) Date of Patent: Apr. 17, 2012

(54) LIGHT EMITTING DEVICE, LIGHT-EMITTING MODULE, LIGHTING APPARATUS, AND IMAGE PROJECTION APPARATUS

(75) Inventors: Kenji Konno, Sakai (JP); Yasumasa Sawai, Yamatotakada (JP)

(73) Assignee: Konica Minolta Opto, Inc., Tokyo (JP)

( * ) Notice: Subject to any disclaimer, the term of this patent is extended or adjusted under 35 U.S.C. 154(b) by 1392 days.

(21) Appl. No.: 11/789,551

(22) Filed: Apr. 25, 2007

(65) Prior Publication Data

US 2007/0252504 A1    Nov. 1, 2007

(30) Foreign Application Priority Data

Apr. 26, 2006 (JP) .................................. 2006-121584
Nov. 20, 2006 (JP) .................................. 2006-313579

(51) Int. Cl.
*H01J 1/62* (2006.01)
(52) U.S. Cl. ........................................ 313/498; 313/495
(58) Field of Classification Search .................. 313/495, 313/498
See application file for complete search history.

(56) References Cited

U.S. PATENT DOCUMENTS

| | | |
|---|---|---|
| 6,318,863 B1 | 11/2001 | Tiao et al. |
| 6,547,400 B1 | 4/2003 | Yokoyama |
| 6,916,097 B2 | 7/2005 | Omoda et al. ................... 353/31 |
| 2004/0207816 A1 | 10/2004 | Omoda et al. ................... 353/31 |
| 2005/0082553 A1 | 4/2005 | Yamamoto et al. ............. 257/83 |
| 2006/0076572 A1 | 4/2006 | Huber et al. .................... 257/99 |

FOREIGN PATENT DOCUMENTS

| | | |
|---|---|---|
| EP | 1 681 729 A1 | 7/2006 |
| JP | 62-279685 A | 12/1987 |
| JP | 01-143366 A | 6/1989 |
| JP | 02-191378 A | 7/1990 |
| JP | 05-38927 A | 5/1993 |
| JP | 2000-58910 A | 2/2000 |
| JP | 2004-335992 A | 11/2004 |
| JP | 2005-129598 A | 5/2005 |
| JP | 2005-159265 A | 6/2005 |
| JP | 2006-64859 A | 3/2006 |
| JP | 2006-84753 A | 3/2006 |
| JP | 2006-100836 A | 4/2006 |

OTHER PUBLICATIONS

International Search Report dated Jul. 10, 2007, for counterpart International Application No. PCT/JP2007/058240 along with a translation thereof.
Written Opinion of the International Searching Authority dated Jul. 10, 2007, for counterpart International Application No. PCT/JP2007/058240 along with a translation thereof.

*Primary Examiner* — Vip Patel
(74) *Attorney, Agent, or Firm* — Cozen O'Connor

(57) ABSTRACT

In a light emitting module arranging therein a plurality of LEDs, each LED includes: an LED chip; and an anode connected to the LED chip. The anode includes: a support surface supporting the LED chip; and an extending part extending with respect to the support surface, and the extending parts in the plurality of LEDs separate from each other.

8 Claims, 22 Drawing Sheets

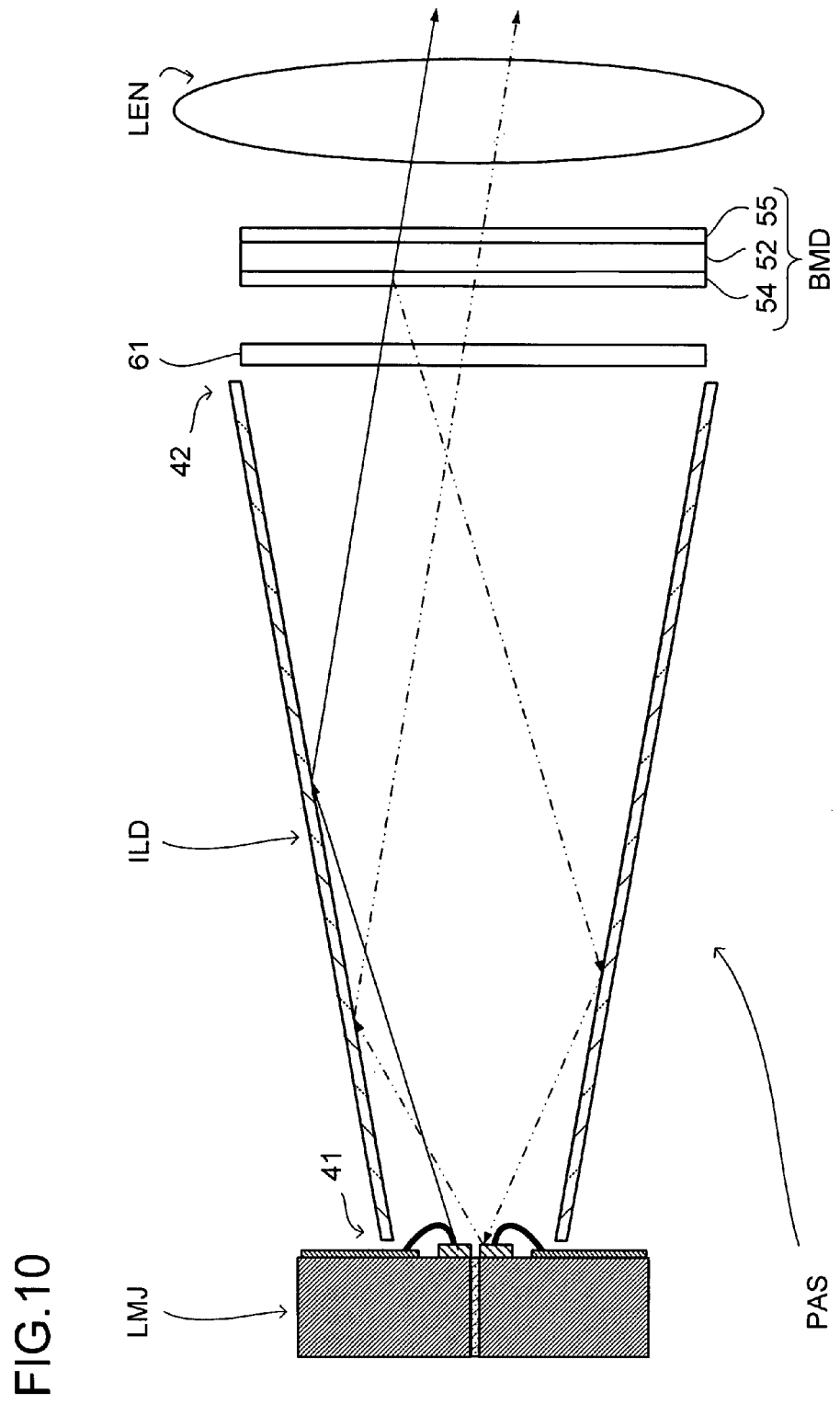

LMJ    5 1 4 21 3 2

LMJ

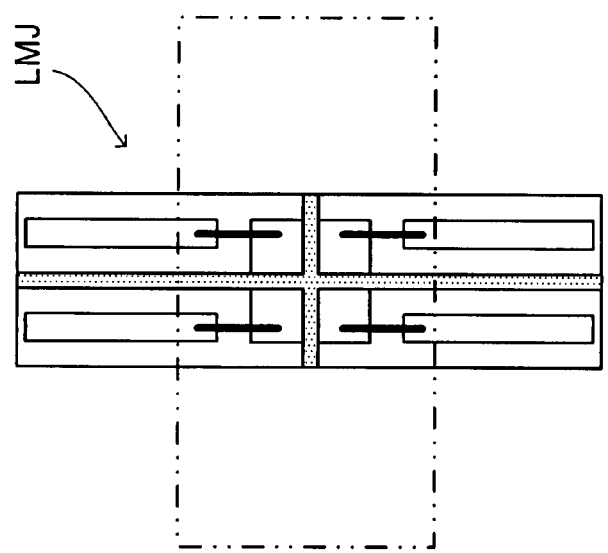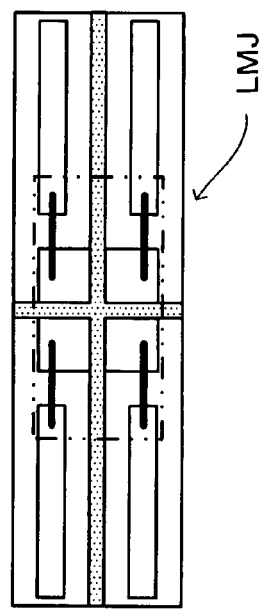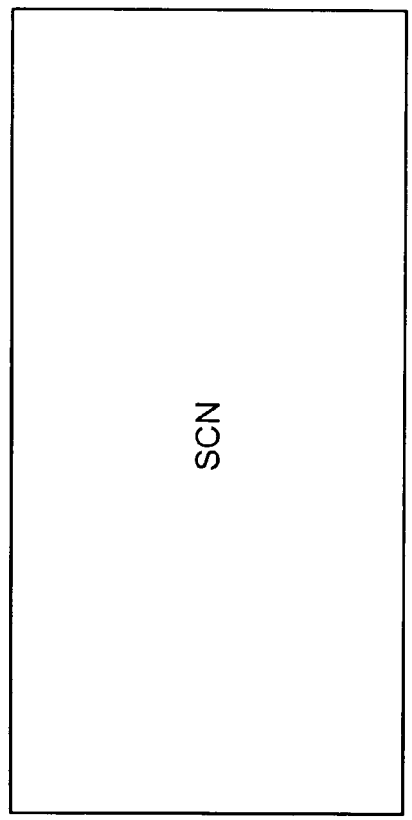

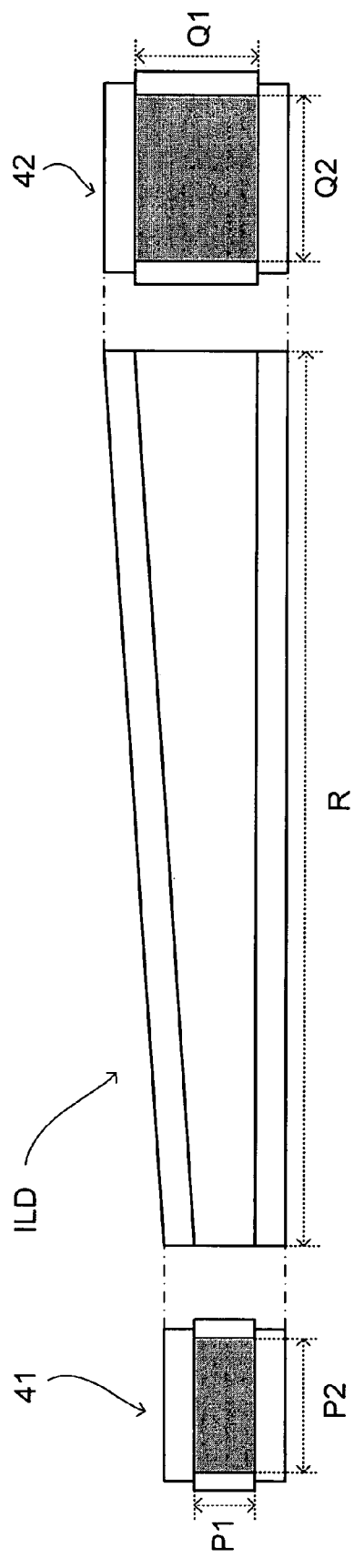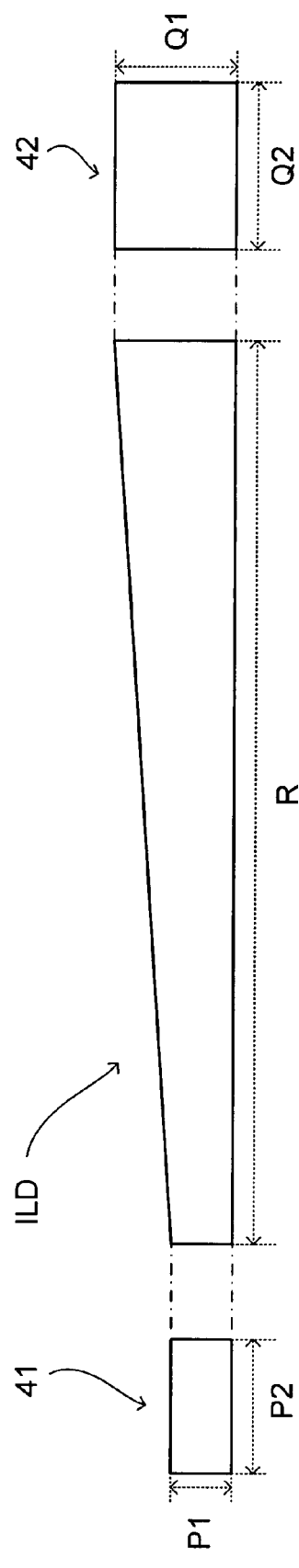
FIG.17A
FIG.17B (A)

FIG.21.A
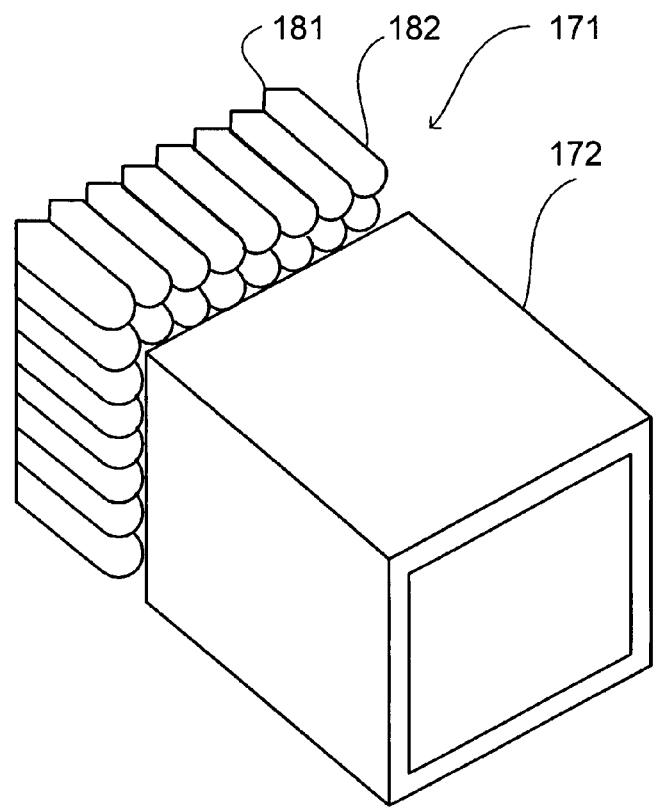
FIG.21.B
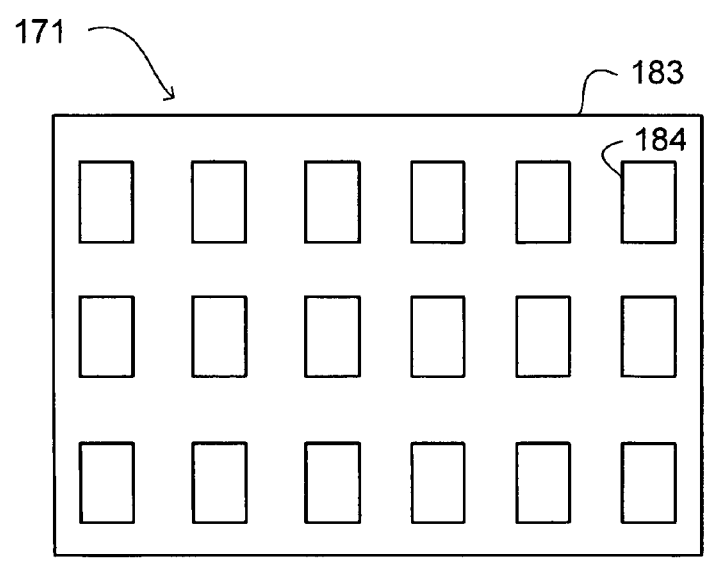

LIGHT EMITTING DEVICE, LIGHT-EMITTING MODULE, LIGHTING APPARATUS, AND IMAGE PROJECTION APPARATUS

Priority is claimed on Japanese Patent Application No. 2006-121584 filed on Apr. 26, 2006 and Japanese Patent Application No. 2006-313579 filed on Nov. 20, 2006, the contents of which are hereby incorporated by reference.

BACKGROUND OF THE INVENTION

1. Technical Field of the Invention

The present invention relates to a light emitting device such as an LED (Light. Emitting Diode) or the like, a module (light emitting module) using a light emitting device, a lighting apparatus loaded with a light emitting module, and further an image projection apparatus loaded with this lighting apparatus.

2. Description of the Related Art

In recent years, various lighting apparatuses using an LED module have been developed. There have been demands imposed on such lighting apparatuses for achieving higher luminance and downsizing. Thus, lighting apparatuses disclosed in patent documents 1 and 2 attempt to achieve higher luminance by using a light emitting module loaded with a plurality of LEDs.

[Patent Document 1] U.S. Pat. No. 6,547,400
[Patent Document 2] U.S. Pat. No. 6,318,863

As shown in FIG. 21A, an LED module 171 of the lighting apparatus disclosed in patent document 1 is loaded with a plurality of LEDs 181 each provided with a shell type cap 182. In such an LED module 171, the shell type cap 182 does not actually emit light but just an LED chip included in the shell type cap 182 emits light. Thus, loading a plurality of LEDs 181 upsizes the LED module 171 and also hardly achieves sufficiently high luminance.

Patent document 1 also discloses a lighting apparatus loaded with an LED module 171 having a plurality of LED chips 184 arranged on one substrate 183 as shown in FIG. 21B. However, when a current flows through the LED module 171, the temperature of the substrate 183 increases due to heat generation of the LED chip 184 caused by the power distribution. In particular, due to the arrangement of a plurality of LED chips 184 on one substrate 183, when one of LED chips 184 is heated by the power distribution, the heat is conducted to other LED chips 184. As a result, the junction temperature is extremely likely to increase, whereby the luminance of the LED module 171 does not become high.

Considering the temperature-related problem, the lighting apparatus 170 of patent document 2 and shown in FIG. 22 is loaded with an LED module 171 using a plurality of low-power LEDs 181 to thereby achieve higher luminance. In particular, this lighting apparatus 170 has integrator rods 172 in correspondence with the respective LEDs 181, thereby achieving higher luminance.

However, due to the low power property of the LED 181, a relatively large number of LEDs 181 needs to be provided inevitably, further requiring the integrator rods 172 in accordance with this number. Thus, this lighting apparatus 170 is extremely upsized, and faces difficulty in simultaneously satisfying demands for achieving both higher luminance and downsizing.

There is one referred to as a power LED capable of ensuring a brightness of several tens of lumens (1 m) to one hundred lumens or more with a relatively large power of several watts (W). Thus, use of an LED module using such a power LED may provide a lighting apparatus which ensures high luminance. However, with only introduction of a large electric power, the LED module fails to ensure high luminance.

The reason for this failure of the LED module to ensure high luminance is as follows. An increase in a current to be distributed in order to introduce a power of several watts heats up the LED chip, thereby causing an increase in the junction temperature whereby the luminance of the LED chip (and thus the LED module) does not become high. Note that the junction temperature characteristic depends on heat dissipation characteristic of the LED module (in another word, it depends on the heat dissipation characteristic of the LED). That is, favorable heat dissipation characteristic of the LED module results in a low junction temperature.

SUMMARY OF THE INVENTION

In view of the circumstance described above, the present invention has been made, and it is an object of the invention to provide a light emitting device and a light emitting module with improved heat dissipation characteristic to thereby provide a light emitting module which simultaneously satisfies both demands for higher luminance and downsizing and a lighting apparatus loaded with this light emitting module, and further an image projection apparatus loaded with this lighting apparatus.

The invention refers to a light emitting device including a first lead electrode and a second lead electrode having mutually opposite potential polarities and a light emitting chip. In this light emitting device, the first lead electrode includes: a support surface supporting the light emitting chip; and an extending part extending with respect to the support surface, and the second lead electrode is located on the support surface of the first lead electrode via an insulator and is electrically connected to the light emitting chip.

The invention also refers to a light emitting module arranging therein a plurality of light emitting devices, each light emitting device including: a light emitting chip; and a first lead electrode connected to the light emitting chip. In particular, the first lead electrode includes: a support surface supporting the light emitting chip; and an extending part extending with respect to the support surface, and the extending parts in the plurality of light emitting devices separate from each other.

The above-mentioned objects and other objects of the invention will be clarified by following description of preferred examples and also by referring to the accompanying drawings.

BRIEF DESCRIPTION OF THE DRAWINGS

FIG. 10 is a sectional view of an image projection apparatus including a different reflective polarizing plate from that of FIG. 9;

FIG. 14A is a plan view of a screen;

FIG. 14B is an explanatory diagram showing how to set the incidence end size of the integrator rod similar to the screen;

FIG. 14C is an explanatory diagram showing how to set the incidence end size of the integrator rod similar to the screen;

FIG. 17A is an explanatory diagram showing a hollow-type integrator rod;

FIG. 17B is an explanatory diagram showing a solid-type integrator rod;

FIG. 21A is a perspective view of a conventional LED module;

FIG. 21B is a plan view showing an LED module as a different example of FIG. 21A.

DETAILED DESCRIPTION OF THE PREFERRED EMBODIMENTS

[First Embodiment]

Hereinafter, one embodiment of the present invention will be described, with reference to the accompanying drawings. In some of the drawings, numerals for members and the like are omitted for convenience, in which case reference to the other drawings should be made. In addition, hatching is omitted from some of the sectional views for convenience.

[1. Image Projection Apparatus]

Figure 15:
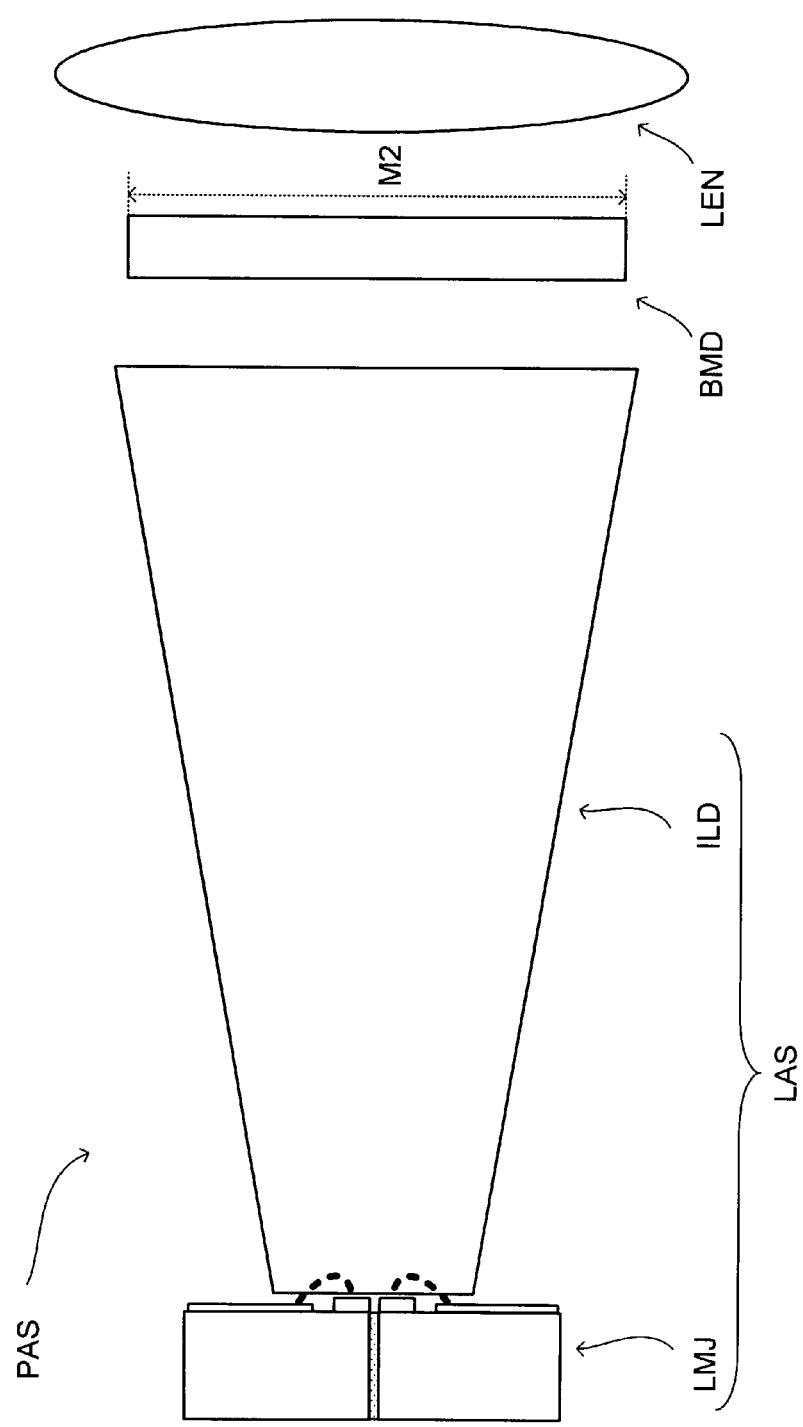
FIG. 15 is a plan view of the image projection apparatus.
Figure 16:
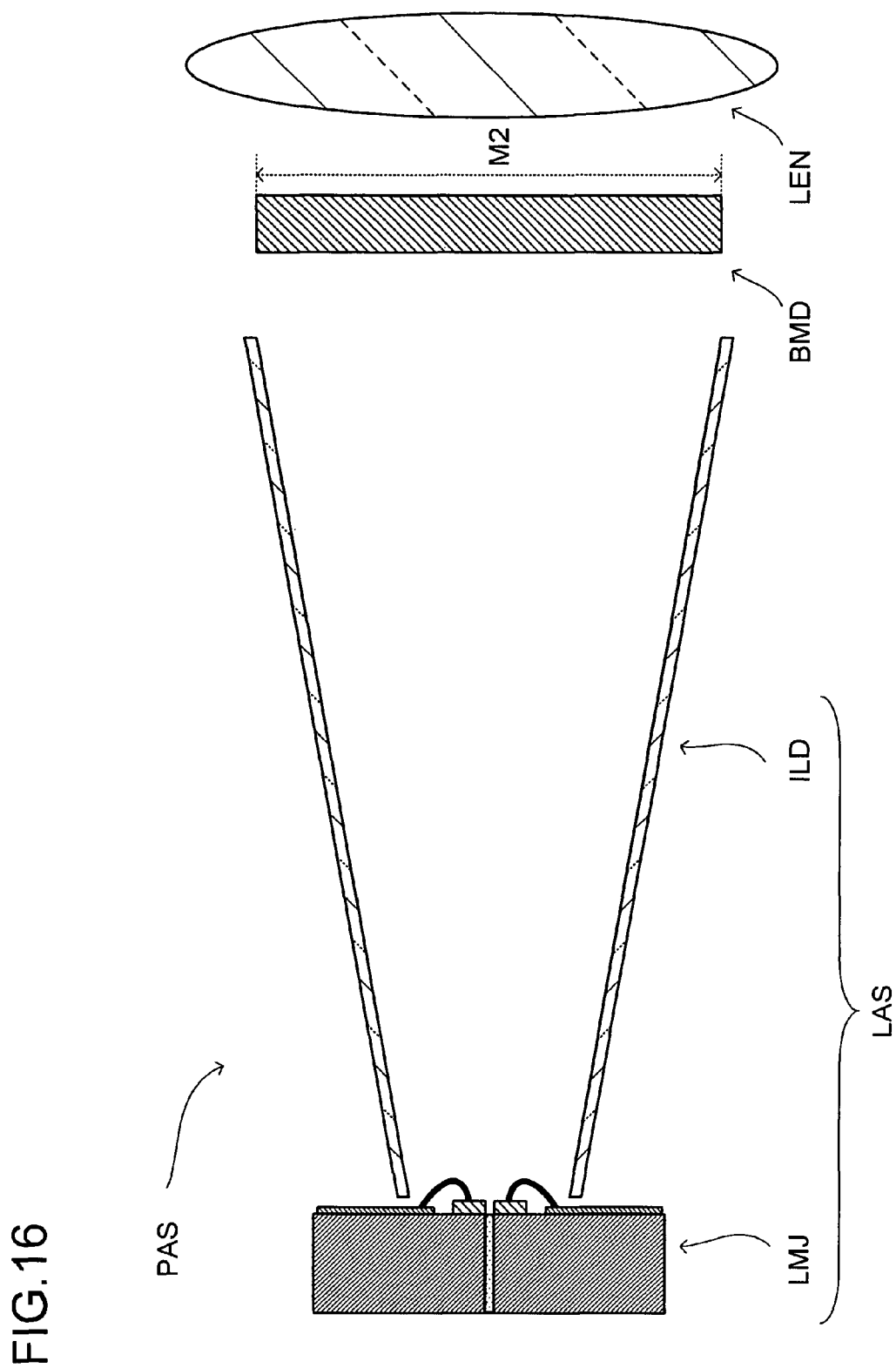
FIG. 16 is a sectional view of the image projection apparatus.

FIG. 15 is a plan view showing external appearance of an image projection apparatus PAS such as a projector or the like. FIG. 16 is a sectional view (horizontal sectional view) along the inner plane of FIG. 15. As shown in FIGS. 15 and 16, the image projection apparatus PAS includes: an LED module (light emitting module) LMJ, an integrator rod (synthetic optical system) ILD, a light modulation device BMD, and a projector lens (projection optical system) LEN.

The LED module LMJ is provided with a plurality of LEDs 9 emitting light (see FIG. 1), although the colors of light emitted by the respective LEDs 9 are not limited. For example, all the LEDs 9 may emit light of the same color, or may emit light of different colors, respectively. However, it is preferable that the LEDs 9 emitting light of at least three colors including red, green, and blue be included, which permits full color light emission. The details of the LED module LMJ will be described later.

The integrator rod ILD uniforms the intensity of light traveling from the LED module LMJ and then emanates the light. As one example of such an integrator rod ILD, as shown in FIGS. 17A and 17B, there is one which is prismatic-shaped and whose both ends (incidence end 41 and exit end 42) have different areas (integrator rod ILD of such a shape is referred to as a taper rod).

The integrator rod ILD may be of a hollow type having a combination of four mirrors as shown in FIG. 17A (with a colored portion shown as the hollow portion) or of a (solid) type having inner contents as shown in FIG. 17B (the integrated rod ILD may have inner contents formed of a glass material or may have resin poured into the hollow shape thereof).

In another word, in order to emanate light with uniform illumination distribution, when light entering one end (light incidence end surface) 41 travels into the integrator rod ILD, the light may be mixed by being repeatedly reflected on the inner side surface and then exits from the other end (light exit end surface) 42.

The light modulation device BMD modulates light exiting from the integrator rod ILD based on image data and the like. Examples of the light modulation device BMD include: a liquid crystal device (transmissive liquid crystal device or reflective liquid crystal device) and a DMD (Digital Micromirror Device manufactured by US Texas Instruments Inc.). Light directed toward the light modulation device BMD is illumination light from the integrator rod ILD, and thus an apparatus including the LED module LMJ and the integrator rod ILD may be referred to as a lighting apparatus LAS.

The projector lens (projection optical system) LEN projects on a screen or the like light modulated by the light modulation device BMD (image light).

In the LED module LMJ, upon emission (that is, upon flow of a current), an LED chip 1 (light emitting chip) [[1]] to be described later generates heat. Therefore, for the purpose of cooling down the heated LED chip 1, a fan FAN (see FIGS. 4 and 5) may be provided.

[1-1. Details of LED Module]

Figure 1:
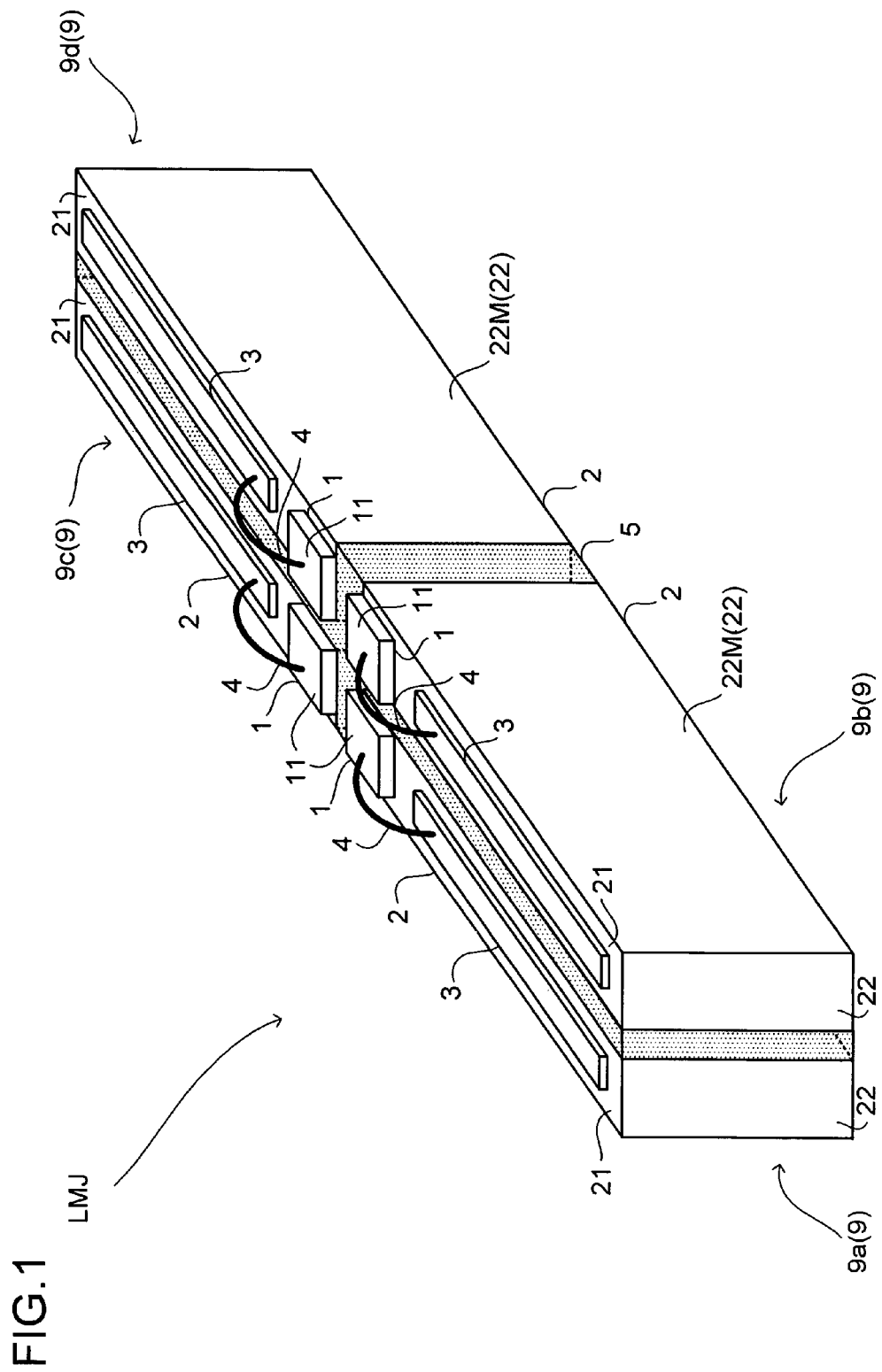
FIG. 1 is a perspective view of an LED module.
Figure 2A:
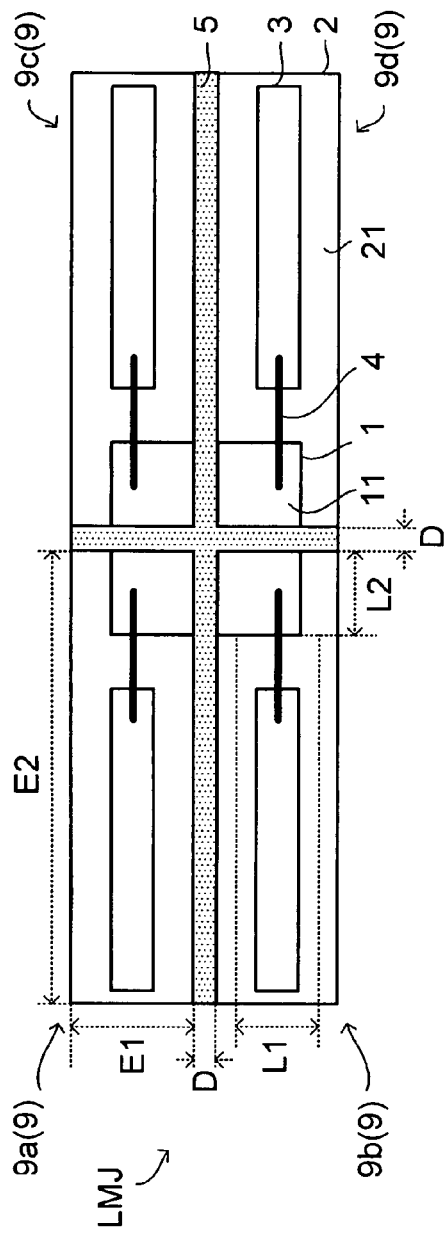
FIG. 2A is a plan view showing a light emission surface of the LED module.
Figure 2C:
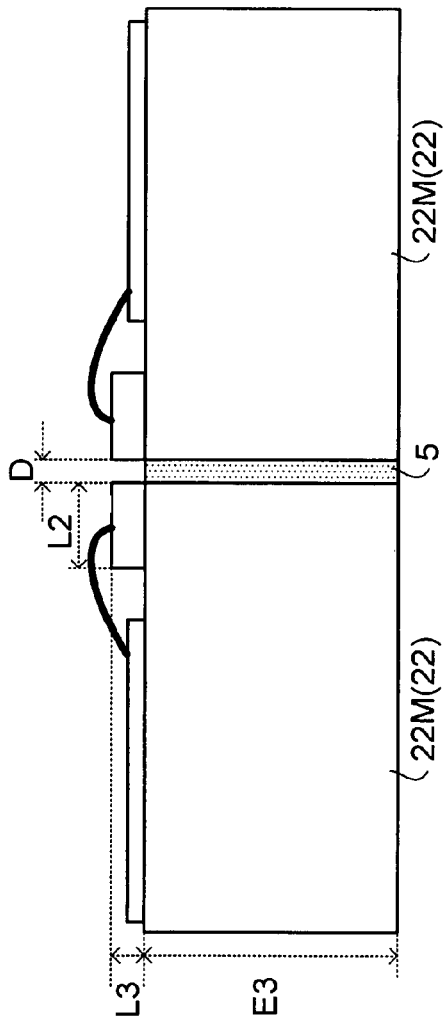
FIG. 2C is a side view illustrating the depth of the LED module.
Figure 2B:
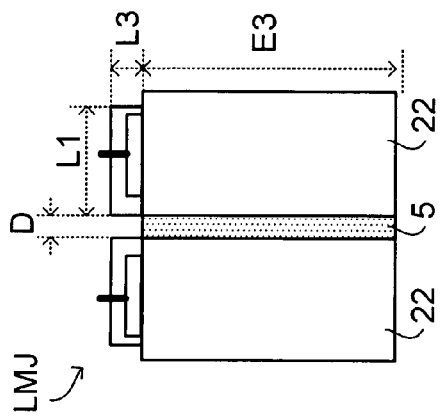
FIG. 2B is a side view illustrating the width direction of the LED module.

Now, referring to FIG. 1 (perspective view) and FIGS. 2A to 2C (views of three surfaces, respectively), the LED module LMJ will be described in detail. As shown in FIG. 1 and FIGS. 2A to 2C, the LED module LMJ includes four LEDs 9 (9a to 9d). Each of the LEDs 9 has the LED chip 1 linked to an anode 2 and a cathode 3 of mutually opposite electric potential polarities (Note that the LED chip 1 and the cathode 3 are linked (that is, wire-bonded) together via a wire 4 of gold having a diameter of approximately 0.03 mm).

However, the anode 2 is so formed as to include such one surface (support surface) 21 that supports the LED chip 1 (the rear surface of a light emission surface 11 of the LED chip 1, or the like) and such a plurality of surfaces 22 that sandwich this one surface. That is, the anode 2 is formed into a polyhedral shape, for example, a plate-like shape, which includes the support surface 21 and surfaces of an extending part (extending surfaces 22) extending with respect to the support surface 21 (therefore, the anode 2 itself can be said as the extending part).

The presence of such an extending part (portion surrounded by the extending surfaces 22), even in the event of heat generation at the LED chip 1 caused by a flow of current into the LED 9 for light emission, permits this heat to be conducted to the support surface 21 and the extending part, thus effectively dissipating the heat of the LED chip 1.

It is preferable that, as shown in FIGS. 2A and 2C, the extending surfaces 22 include a surface having a wider area than the support surface 21, because, with the presence of the extending surface 22 of a relatively wide area, the outside air efficiently contacts this extending surface 22 whereby the heat effectively escapes.

Then, if the anode 2 succeeds in quickly cooling down the LED chip 1 (that is, if the anode 2 succeeds in preventing an increase in the junction temperature), an increase in the temperature of the LED chip 1 can be prevented, thereby achieving higher luminance. The anode 2 can make the heat to escape by bringing not only the extending surface 22 having a wider surface than the support surface 21 but also the extending surface 22 having a narrower area than the support surface 21 or the support surface 21 itself into contact with the outside air (that is, the anode 2 itself serves as a heat dissipater).

There is a preferable condition for radiating the heat of the LED chip 1 via the anode 2 ad described above, which is provided below as conditional formula A (conditional formula (1)). For easier understanding of this conditional formula A, meanings of symbols defining the sizes of the anode 2 and the LED chip 1 shown in FIG. 2 are also provided.

LED chip
L1: denotes the width (in mm) of the light emission surface 11 of the LED chip 1;
L2: denotes the depth (in mm) of the light emission surface 11 of the LED chip 1; and
L3: denotes the thickness (in mm) of the light emission surface 111 of the LED chip 1 1.

Anode
E1: denotes the width (in mm) of the anode 2;
L2: denotes the depth (in mm) of the anode 2; and
L3: denotes the thickness (in mm) of the anode 2.

$$1.0 < E3/Lmax < 10.0 \qquad \text{Conditional formula A,}$$

where
E3: denotes the length of the anode 2 in the direction along the optical axis direction of light from the LED chip 1 (that is, the thickness of the anode 2); and Lmax: denotes the longest length at the outer edge end of the light emission surface 11 of the LED chip 1 (that is, the length of L1 or L2, whichever is longer).

If the value of E3/Lmax is equal to or smaller than the lower limit of this conditional formula A, E3 is relatively short and Lmax is relatively long. Accordingly, the anode 2 is small for the LED chip 1, thus resulting in failure to sufficiently dissipate generated at the LED chip 1. However, the relatively small size of the anode 2 permits achieving downsizing of the LED 9.

On the other hand, if the value of E3/Lmax is equal to or larger than the upper limit of this conditional formula A, E is relatively long and Lmax is relatively short. Accordingly, the anode 2 is large for the LED chip 1, thus resulting in failure to achieve downsizing of the LED 9. However, the relatively large size of the anode 2 permits sufficiently dissipating heat generated at the LED chip 1.

Therefore, setting E3 and Lmax so that they fall within the range of the conditional formula A suppresses an increase in the temperature of the LED chip 1 while suppressing the upsizing of the LED 9 (and thus the LED module LMJ).

It is preferable that, within the conditional range of the conditional formula A, a range of conditional formula A' below be fulfilled:

$$2 < E3/Lmax < 6 \qquad \text{Conditional formula A'.}$$

Figure 19A:
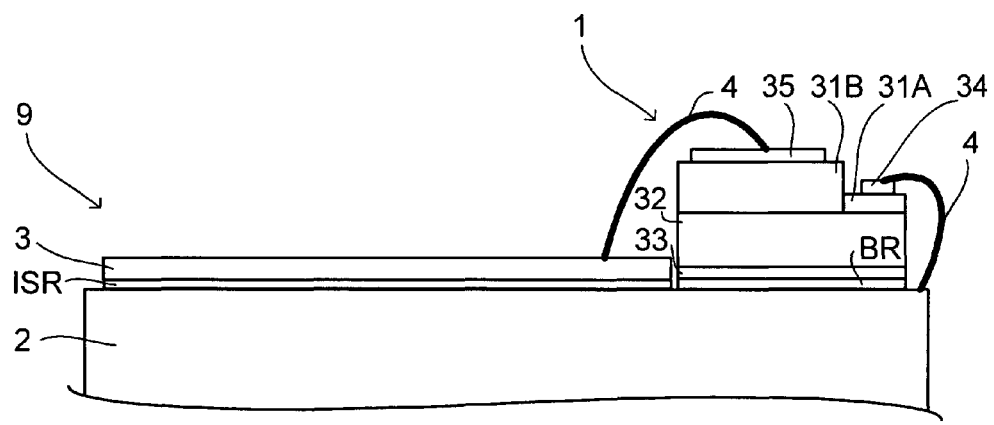
FIG. 19A is a side view of the LED.

The cathode 3 may be, like the anode 2, formed into a plate-like shape or the like. However, the cathode 3 is supported by (fitted to) the support surface 21 of the anode 2 via an insulator ISR (see FIG. 19A to be described later). Thus, it is preferable that one surface of the cathode 3 supported by the support surface 21 is so sized as to be included in the support surface 21, because this makes the cathode 3 less likely to come off (detach from) the support surface 21.

The LED chip 1 is also supported by the support surface 21 of the anode 2. Accordingly, it is preferable that one surface of the LED chip 1 supported by the support surface 21 be so sized as to be included in the support surface 21 for the purpose of preventing separation of the both from each other. The wire 4 linking together the LED chip 1 and the cathode 3, and the cathode 3, like the anode 2, serve as heat dissipaters.

Collection of a plurality of LEDs 9 as describe above completes the LED module LMJ, although the number and arrangement of LEDs 9 are not specifically limited. For example, as shown by the plan view of FIG. 2A, the four LED 9s (9a to 9d) may be arranged in a matrix form (more specifically, the matrix is formed by arranging the two LEDs 9 (9a and 9c) in one direction on the same plane and arranging the LEDs 9 (9a and 9b) in the direction vertical to this one direction).

To set one light exit direction of the LED module LMJ by providing the same light exit direction for all the light emitting chips 1, all the light emission surfaces 11 of the LED chips 1 may be oriented in the same direction. Further, these LEDs 9, more specifically, the extending surfaces 22 thereof, are configured to separate from each other.

The separation of the extending surfaces 22 from each other as described above makes it difficult to conduct the heat generated as the LED chip 1. That is, even when one of the four LED chips 1 of FIG. 1 is heated, the heat is not conducted to the other The LED chips 1, thus suppressing an increase in the junction temperature at the LED chips 1.

There is preferable arrangement of the LED chip 1 for preventing heat conduction between the LED chips 1. Conditional formula B (conditional formula (2)) below defines this arrangement.

$$0.7 < AL/AR < 0.98 \qquad \text{Conditional formula B,}$$

where

AL: denotes the light emission area (in mm$^2$) of all the LED chips 1 in the plurality of LEDs 9; and AR: denotes the area (in mm$^2$) of a region which is outer periphery surrounding the light emission surfaces 11 of all the LED chips 1 in the plurality of LEDs 9 and which is defined by the shortest outer peripheral length.

Figure 3:
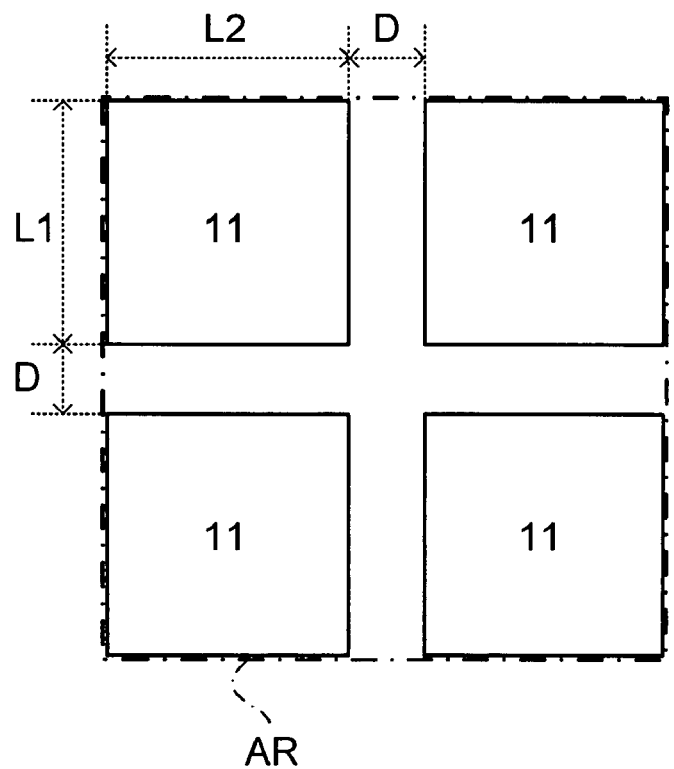
FIG. 3 is an explanatory diagram showing the relationship between AL and AR.

FIG. 3 illustrates and explains AL and AR in this conditional formula B. Specifically, AL denotes the area of the light emission surfaces 11 of the four LED chips 1, that is, an area of "L1×L2×4" (total area of the light emission surfaces 11 of the four LED chips 1).

On the other hand, AR is obtained by taking into consideration the interval between the LED chips 1, that is, in FIGS. 1 and 2A to 2C, the shortest interval between the extending surfaces 22 of the anodes 2 of the plurality of LEDs. Specifically, AR is an area calculated by "(L1+D+L1)×(L2+D+L2)", because calculating the outer periphery surrounding the light emission surfaces 11 of all the LED chips 1 while not providing the shortest interval between the extending surfaces 22 does not provide the shortest outer periphery (AR is a region indicated by a dashed line).

If the value of AL/AR is equal to or smaller than the lower limit in this conditional formula B, AR is relatively wide and AL is relatively narrow. Accordingly, the interval between the LED chips 1 is relatively wide, which may result in difficulty in achieving higher luminance provided by the LED module LMJ or may result in a relatively large-size LED module LMJ. However, the relatively wide interval between the LED chips 1 results in difficulty in heat conduction between the LED chips 1.

On the other hand, if the value of AL/AR is equal to or larger than the upper limit of this conditional formula B, AR is relatively narrow and AL is relatively wide. Accordingly, the interval between the LED chips 1 is relatively narrow, thus making it easy to conduct heat between the LED chips 1.

Therefore, setting AL and AR so that they fall within the range of the conditional formula B suppresses heat conduction between the LED chips 1 while suppressing a decrease in the luminance provided by the LED module LMJ, upsizing thereof, and the like.

It is preferable that, within the conditional range defined by the conditional formula B, a range of conditional formula B' below be fulfilled:

$$0.8 < AL/AR < 0.95 \quad \text{Conditional formula B'.}$$

Moreover, it is preferable that conditional formula C (conditional formula (3)) below defined by the interval between the anodes 2 in the plurality of LEDs 9 (more specifically, the shortest interval (D) between the extending surfaces 22) and the longest length (Lmax) at the outer edge end of the light emission surface 11 of the LED chip 1:

$$0.01 < D/Lmax < 0.5 \quad \text{Conditional formula C.}$$

If the value of D/Lmax is equal to or smaller than the lower limit of this conditional formula C, D is relatively short and Lmax is relatively long. Accordingly, the LEDs 9 having the LED chips 1 of a relatively wide area are arranged at a relatively high density, thus making it easy to conduct heat between the anodes 2 (and thus between the LEDs 9). Moreover, this may cause leak between the anodes 2 but makes it easy to achieve higher luminance and also provides a relative small-size LED module LMJ.

On the other hand, if the value of D/Lmax is equal to or larger than the upper limit of this conditional formula C, D is relatively long and Lmax is relatively short. Accordingly, the LEDs 9 having the LED chips 1 of a relatively narrow area are separated from each other at a relatively wide interval, thus making it difficult to achieve higher luminance provided by the LED module LMJ and also providing a relatively large-size LED module LMJ. However, the relatively wide interval between the anodes 2 makes it difficult to conduct heat and further permits reliable electrical insulation between the anodes 2.

Therefore, setting D and Lmax so that they fall within the range of the conditional formula C provides the same effect provided by the range of the conditional formula B, that is, suppresses heat conduction between the LEDs 9 (and thus between the LED chips 1) while suppressing a decrease in the luminance provided by the LED module LMJ, upsizing thereof, and the like. Moreover, this suppresses occurrence of leak at the LED module LMJ.

It is preferable that, within the conditional range of the conditional formula C, a range of conditional formula C' below be fulfilled:

$$0.03 < D/Lmax < 0.15 \quad \text{Conditional formula C'.}$$

In the LED module LMJ shown in FIGS. 1 and 2A to 2C, there exits an insulator 5 between the LEDs 9 (more specifically, between the anodes 2). The presence of the insulator 5 as described above permits reliably preventing heat conduction between the LEDs 9. However, even without the presence of the insulator 5, heat conduction can be prevented satisfactorily if the LEDs 9 are separated from each other, because the air plays a role as an insulator.

However, to effectively prevent heat conduction between the LEDs 9 as much as possible, it is preferable that an insulator lie in at least part of a space provided by the separation of the extending surfaces 22 of the anodes 2 in the plurality of LEDs 9. The insulator 5 has preferably ½₀ or below of the thermal conductivity (approximately 403 W/m·K) possessed by the anode 2 or the cathode 3. Therefore, a silicon sheet (with a thermal conductivity of approximately 2.5 W/m·K) or epoxy resin (with a thermal conductivity of approximately 0.19 W/m·K) is a preferable material.

When a fan FAN (either a blower fan or a suction fan) is provided in the image projection apparatus PAS, it is preferable that the wind be effectively blown against the anode 2. For example, the wind is desirably directed along the extending surfaces 22 of the anodes 2 in the plurality of LEDs 9.

Figure 4A:
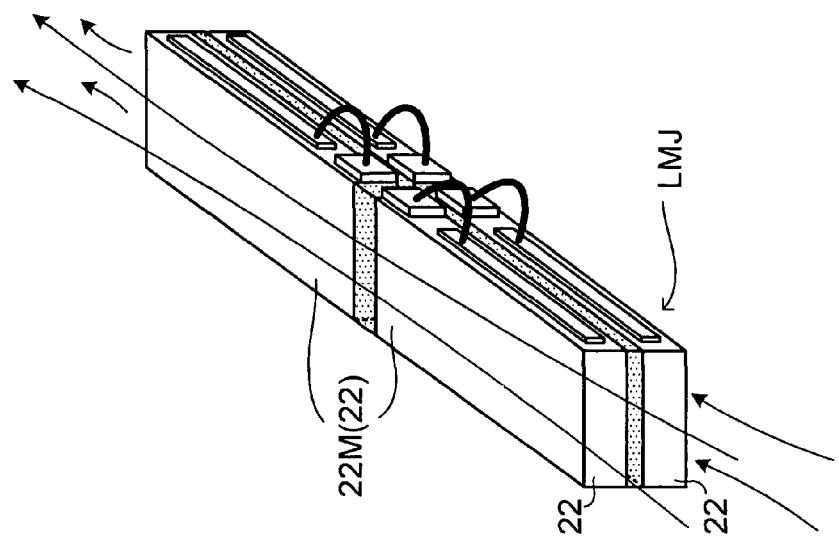
FIG. 4A is a plan view showing wind along a largest extending surface of extending surfaces of the LED module.
Figure 4B:
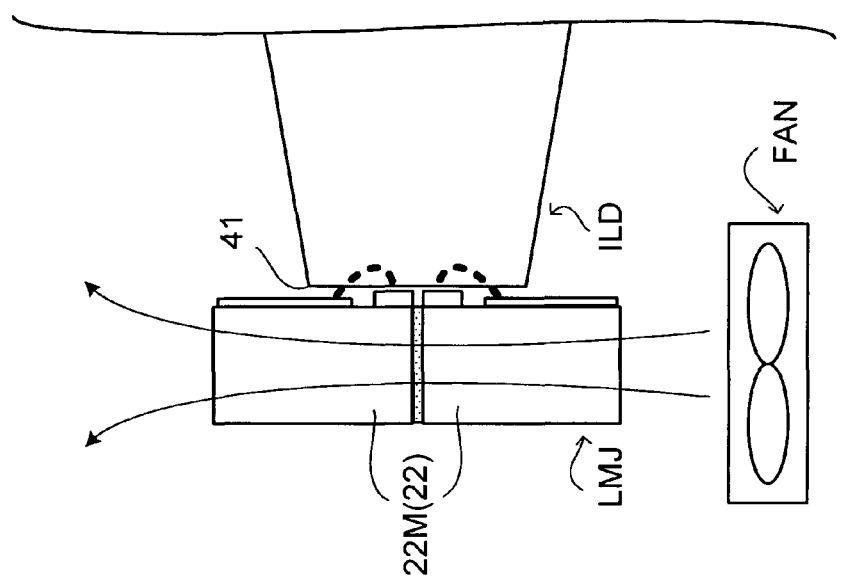
FIG. 4B is a perspective view showing wind along the largest extending surface of the extending surfaces of the LED module.
Figure 5A:
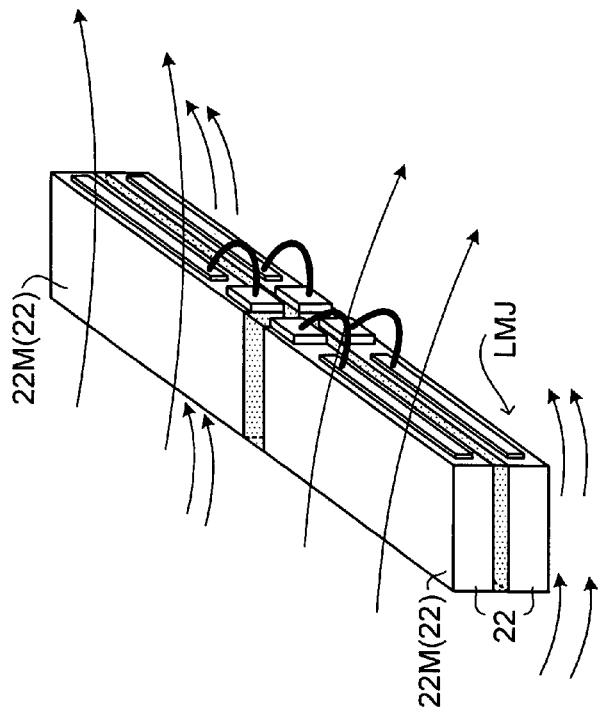
FIG. 5A is a plan view showing wind along all the extending surfaces of the LED module.
Figure 5B:
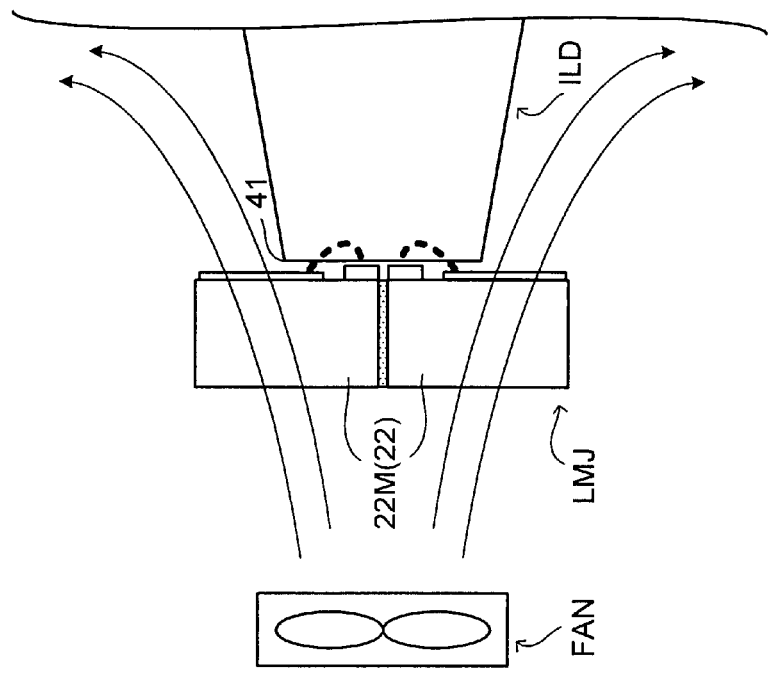
FIG. 5B is a perspective view showing wind along all the extending surfaces of the LED module.

This especially applies to, as shown in FIGS. 4A and 4B (plan view and perspective view) and FIGS. 5A and 5B (plan view and perspective view), a case where the extending surface 22 of one of the anodes 2 of the respective LEDs 9 having a largest area is a largest extending surface 22M and all the planes of the largest extending surface 22M are parallel to each other. For example, as shown in FIGS. 4A and 4B, if the fan FAN blows wind in the direction vertical to the thickness and width directions of the anode 2, the wind originating from the fan FAN effectively blows along the largest extending surface 22M, thus improving the heat dissipation property.

As shown in FIGS. 5A and 5B, when the fan FAN blows wind in the direction equal to the thickness direction of the anode 2 and also in the direction vertical to the width direction thereof, the wind originating from the fan FAN is directed along the largest extending surface 22M and other extending surfaces 22 (almost all the extending surfaces 22), thus reliably improving the heat dissipation property. In FIGS. 4A and 4B and FIGS. 5A and 5B, the wind originating from the fan FAN is indicated by arrows, although not limited thereto. That is, the wind originating from the fan FAN may be wind provided by suction.

[1-2. Details of a Lighting Apparatus]

Next, description will be given, referring to the lighting apparatus LAS including the LED module LMJ as described above and the integrator rod ILD having the incidence end 41 where light enters and the exit end 42 where light traveling from the incidence end 41 is synthesized and then emanated.

Figure 6A:
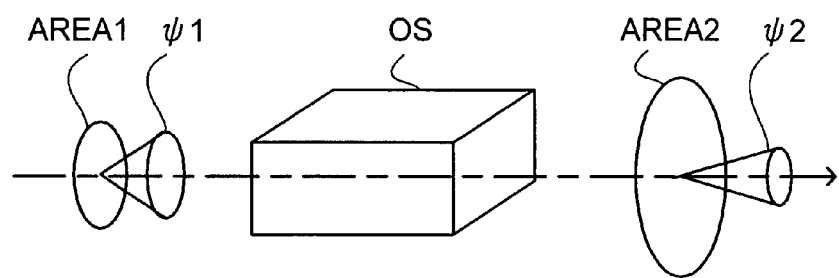
FIG. 6A is a diagram explaining ETENDUE invariant.
Figure 6B:
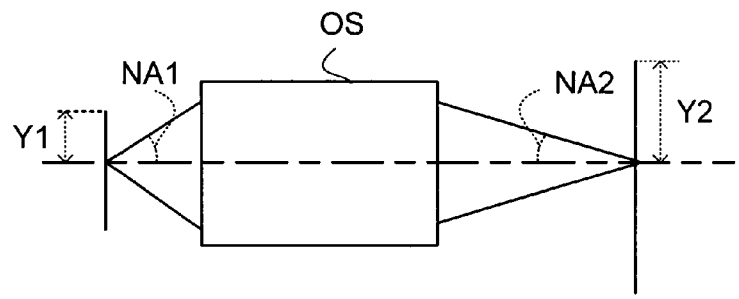
FIG. 6B is a diagram explaining LAGRANGE invariant.

In application of a synthetic optical system such as an integrator rod, ETENDUE invariant and LAGRANGE invariant are known whose principles can be explained in FIGS. 6A and 6B.

For example, FIG. 6A corresponds to the description of the ETENDUE invariant. Where the area of a beam on the incidence end side of the synthetic optical system OS (the light emission area of the LED module LMJ or the like) is AREA 1 and the solid angle of this beam is $\phi 1$ while the area of a beam on the exit end side of the synthetic optical system OS is AREA 2 and the solid angle of this beam is $\phi 2$, the principle below holds:

$$AREA1 \times \phi1 = AREA2 \times \phi2 \qquad \text{ETENDUE invariant.}$$

On the other hand, FIG. 6B corresponds to the description of the LAGRANGE invariant. Where an image height on the incidence end side of the synthetic optical system OS is Y1 and the ray angle thereof is NA 1 while the image height on the exit end side of the synthetic optical system OS is Y2 and the ray angle thereof is NA 2, the principle below holds:

$$Y1 \times NA1 = Y2 \times NA2 \qquad \text{LAGRANGE invariant.}$$

In view of the principles as described above, to guide light of a desired solid angle ($\phi 2$) (or desired ray angle (NA2)) for the light modulation device BMD, it is better to appropriately set various parameters. More specifically, it is preferable that conditional formula D below be fulfilled. For easier understanding of this conditional formula D, there are also provided meanings of symbols defining the size of the integrator rod ILD (see FIGS. 17A and 17B).

Length of the integrator rod ILD
R: denotes the full length (in mm) of the integrator rod ILD.
For the incidence end 41 of the integrator rod ILD
P1: denotes the length (in mm) in one direction within the plane of the incidence end 41 (also referred to as longitudinal length for convenience).
P2: denotes the length (in mm) in the direction vertical to the aforementioned one direction within the plane of the incidence end 41 (also referred to as lateral length for convenience).
For the exit end 42 of the integrator rod ILD
Q1: denotes the length (in mm) in the direction equal to the aforementioned one direction of the incidence end 41 within the plane of the exit end 42 (also referred to as a longitudinal length).
Q2: denotes the length (in mm) in the direction vertical to the aforementioned one direction of the incidence end 41 within the plane of the exit end 42 (also referred to as lateral length).

$$2 < AQ/AP < 30 \qquad \text{Conditional formula D,}$$

where
AQ: denotes the area (in mm$^2$) of the exit end 42 of the integrator rod ILD; and
AP: denotes the area (in mm$^2$) of the incidence end 41 of the integrator rod ILD.

For example, assume that the emission area of all the LED chips 1 in the plurality of LEDs 9 is defined and further that the LED chip 1, which emits light in all directions, emits light directed toward the anode 2 side but blocked and emits light of a predetermined solid angle (a hemispherical solid angle) directed toward the opposite side. To receive the light of the predetermined solid angle on the incidence end side of the integrator rod ILD, the area (AP) of the incidence end 41 of the integrator rod ILD is also limited to some degree. Thus, to guide light of a desired solid angle (to provide desired light directivity) on the exit end side of the integrator rod ILD, the area (AQ) of the exit end 42 of the integrator rod ILD is critical. Thus, the conditional formula D is defined by the ratio between the area of the incidence end 41 and the area of the exit end 42 in the integrator rod ILD.

If the value of AQ/AP is equal to or smaller than the lower limit of this conditional formula D, for example, AQ is relatively narrow. Accordingly, light of a relatively large solid angle (light of low directivity) exits from the integrator rod ILD. Thus, in application of such a lighting apparatus LAS to the image projection apparatus PAS, light of a relatively large solid angle is blocked (vignetted) by an aperture stop, not shown, of the projector lens LEN. However, the area of the incidence end 41 and the area of the exit end 42 are close to each other, thus making it easy to manufacture the integrator rod ILD.

On the other hand, if the value of AQ/AP is equal to or larger than the upper limit of this conditional formula D, for example, AQ is relatively wide. Accordingly, light of a relatively small solid angle (light of high directivity) exits from the integrator rod ILD. However, it is extremely difficult to manufacture the integrator rod ILD having a large area difference between the incidence end 41 and the exit end 42, because the tilt angle (tapered angle) of a column of the integrator rode ILD linking together the incidence end 41 and the exit end 42 is very large.

A large area ratio between the incidence end 41 and the exit end 42 as well as a relatively small-size is more likely to result in a large tilt angle and also reduces a smaller number of times of reflection of the light inside the integrator rod ILD. Thus, mixing is insufficient, thus leading to failure to provide uniform light intensity distribution at the exit end 42.

Therefore, setting AQ and AP so that they fall within the range of the conditional formula D reduces the difficulty in manufacturing the integrator rod ILD while suppressing deterioration in the use efficiency of light exiting from the integrator rod ILD.

It is preferable that, within the conditional range of the conditional formula D, a range of conditional formula D' below be fulfilled:

$$8 < AQ/AP < 20 \qquad \text{Conditional formula D'.}$$

It is preferable that the lighting apparatus LAS fulfill conditional formula E (conditional formula (4)) below:

$$0.3 < AL/AP < 0.95 \qquad \text{Conditional formula E,}$$

where
AL: denotes the light emission area (in mm$^2$) of all the LED chips 1 in the plurality of LEDs 9; and
AP: denotes the area (in mm$^2$) of the incidence end 41 of the integrator rod ILD.

Figure 7:
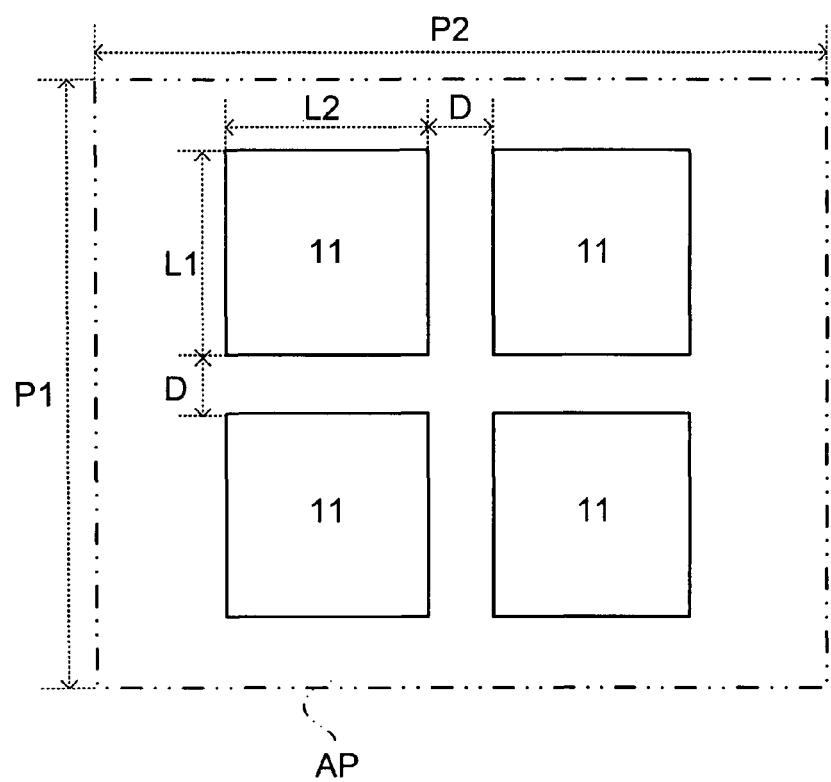
FIG. 7 is an explanatory drawing showing the relationship between AL and AP.

FIG. 7 illustrates and explains AL and AP in this conditional formula E. Specifically, AL denotes, as described above, the area ("L1×L2×4") of the light emission surfaces 11 of the four LED chips 1. On the other hand, AP denotes, for the incidence end 41 whose surface is shaped into a rectangle as in FIG. 7, the area obtained from P1 as the longitudinal length of the rectangle and P2 as the lateral length of the rectangle ("P1×P2"); AP is also a region indicated by a double-dashed line).

For example, defining the incidence end 41 and the exit end 42 of the integrator rod ILD limits the solid angle of light from the LED chip 1 to some degrees in order to guide light to the incidence end 41 of the integrator rod ILD. Accordingly, to guide light of a desired solid angle (angle of divergence) on the exit end side of the integrator rod ILD, the light emission area of all the LED chips 1 in the plurality of LEDs 9 is critical. Thus, the conditional formula E is defined by the ratio between the light emission area of all the LED chips 1 in the plurality of LEDs 9 and the area of the incidence end 41 in the integrator rod ILD.

If the value of AL/AP is equal to or smaller than the lower limit of this conditional formula E, the area occupied by all the LED chips 1 with respect to the area of the incidence end 41 in the integrator rod ILD is narrow. Accordingly, the relatively wide light emission area of all the LED chips 1 results in a, relatively large solid angle of light exiting from the integrator rod ILD. That is, light of low directivity exits from the integrator rod ILD and blocked by the aperture stop, not shown, of the projector lens LEN. However, for example when the LED chips 1 are roughly arranged, the heat dissipation property of the LED chip 1 improves.

On the other hand, if the value of AL/AP is equal to or larger than the upper limit of this conditional formula E, the area occupied by all the LED chips 1 with respect to the area of the incidence end 41 in the integrator rod ILD is wide. Accordingly, for example when the LED chips 1 are closely arranged, the heat dissipation property of the LED chip 1 deteriorates. The relatively narrow light emission area of all the LED chips 1 results in light of a relatively small solid angle exiting from the integrator rod ILD. That is, the light of high directivity exits from the integrator rod ILD and reliably reaches the light modulation device BMD.

Therefore, setting AL and AP so that they fall within the range of the conditional formula E suppresses deterioration in the heat dissipation property of the LED chip 1 while suppressing deterioration in the use efficiency of light exiting from the integrator rod ILD.

It is preferable that, within the conditional range of the conditional formula E, a range of conditional formula E' be fulfilled:

$$0.5 < AL/AP < 0.7 \qquad \text{Conditional formula E'.}$$

If all of light from the LED module LMJ does not enter the incidence end 41 of the integrator rod ILD, light of the LED module LMJ is not effectively used. To avoid this situation, it is preferable that the lighting apparatus LAS fulfill conditional formula F below.

$$0.05 < G/L\text{max} < 0.5 \qquad \text{Conditional formula F,}$$

where
  G: denotes the length (in mm) of the shortest interval between the LED chip 1 and the integrator rod ILD in the direction along the optical axis direction of light from the LED chip 1; and
  Lmax: denotes the longest length (in mm) at the outer edge end of the light emission surface 11 in the LED chip 1.

Figure 8A:
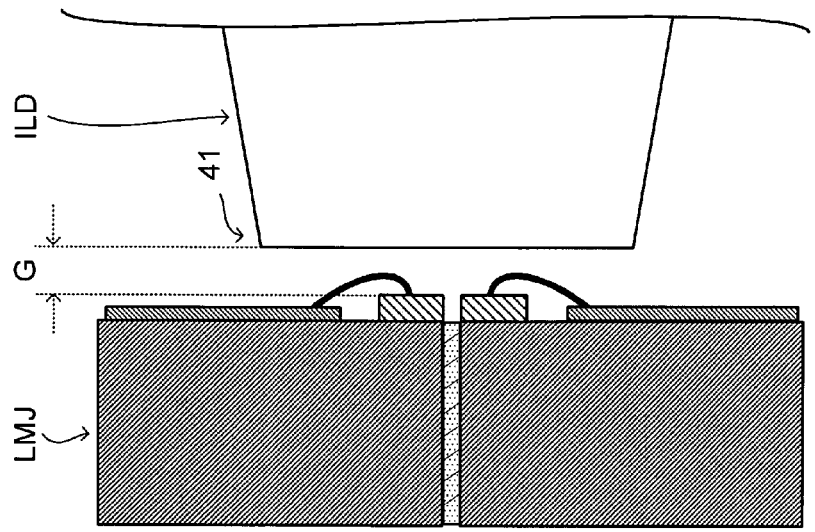
FIG. 8A is a sectional view showing a length (G) of the shortest interval between an LIED chip and an integrator rod in a direction along the optical axis direction of light from the LED chip, where (G) is provided for a hollow-type integrator rod.
Figure 8B:
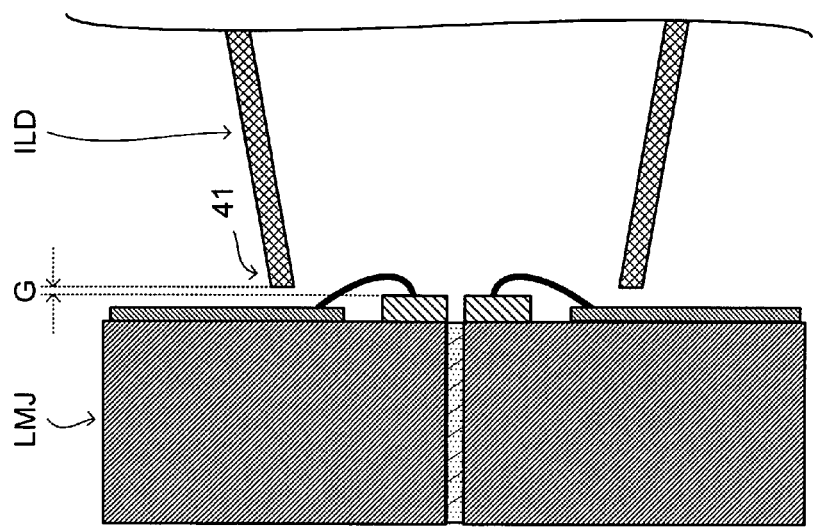
FIG. 8B is a sectional view showing a length (G) of the shortest interval between the LED chip and the integrator rod in the direction along the optical axis direction of light from the LED chip, where (G) is provided for a solid-type integrator rod.

FIGS. 8A and 8B illustrate and explains G in this conditional formula F. Specifically, for a hollow integrator rod ILD as shown in FIG. 8A, G corresponds to the length of an interval between the outer edge of the incidence end 41 and the LED chip 1, which length is measured in the dirction along the optical axis direction of light from the LED chip 1. On the other hand, for a solid integrator rod ILD as shown in FIG. 8B, G corresponds to the length of an interval between the surface of the incidence end 41 and the LED chip 1, which length is measured in the direction along the optical axis direction of light from the LED chip 1.

If the value of G/Lmax is equal to or smaller than the lower limit of this conditional formula F, for example, G is relatively short. Consequently, due to manufacturing error in manufacturing processes of the lighting apparatus LAS, the LED module LMJ and the integrator rod ILD collide with each other (that is, it is difficult to mass-produce the lighting apparatus LAS). However, the relatively short G makes it easy for all light from the LED module LMJ to enter the incidence end 41 of the integrator rod ILD.

On the other hand, if the value of G/Lmax is equal to or larger than the upper limit of this conditional formula F, for example, G is relatively long. Accordingly, part of light from the LED module LMJ is difficult to enter the incidence end 41 of the integrator rod ILD. Moreover, it is difficult to achieve a small-size light apparatus LAS. However, the relatively long G permits achieving a lighting apparatus LAS which is relatively less susceptible to manufacturing errors.

Therefore, setting G and Lmax so that they fall within the range of conditional formula F suppresses upsizing of the lighting apparatus LAS while ensuring the mass productivity thereof, and further suppresses deterioration in the use efficiency of light of the LED module LMJ.

It is preferable that, within the conditional range defined by the conditional formula F, a range of conditional formula F' below be fulfilled:

$$0.08 < G/L\text{max} < 0.4 \qquad \text{Conditional formula F'.}$$

[Second Embodiment]

Now, the second embodiment will be described below. Members having the same function as that of the members used in the first embodiment are provided with the same numerals and thus omitted from the description.

In the first embodiment, the description has been given above, referring to the image projection apparatus PAS including at least the light modulation device BMD which modulates light from the lighting apparatus in accordance with image data and the projector lens LEN which projects on a projection target surface (screen or the like) the light modulated by the light modulation device BMD.

Therefore, the image projection apparatus PAS may also include other members (the image projection apparatus PAS described in the first embodiment includes the fan FAN). Examples of such members include members (a polarized light conversion unit, a reflective polarizing plate, a wave plate, and the like to be described later) for adjusting light entering the light modulation device BMD when this light modulation device BMD is a liquid crystal device (transmissive liquid crystal device in particular) BMD using light. Hereinafter, these members will be described.

Usually, the liquid crystal device BMD, in order to use polarized light, has polarizing plates provided on the incidence side and the exit side, respectively, of a liquid crystal layer. If an absorption-type polarizing plate is provided on the incidence side of the liquid crystal layer, this absorption-type polarizing plate absorbs polarized light traveling in a particular direction and thereby increases its temperature. Thus, to prevent this increase in the temperature of the absorption-type polarizing plate, for example, a polarized light conversion unit including a polarized beam splitter (PBS) and a ½ wave plate (phase plate) is provided on the incidence side of the liquid crystal device, because the presence of such a polarized light conversion prevents, of non-polarized light (randomly polarized light) from the LED module LMJ, the polarized light unnecessary for transmission at the liquid crystal device BMD, from reaching the absorption type polarizing plate.

Figure 9:
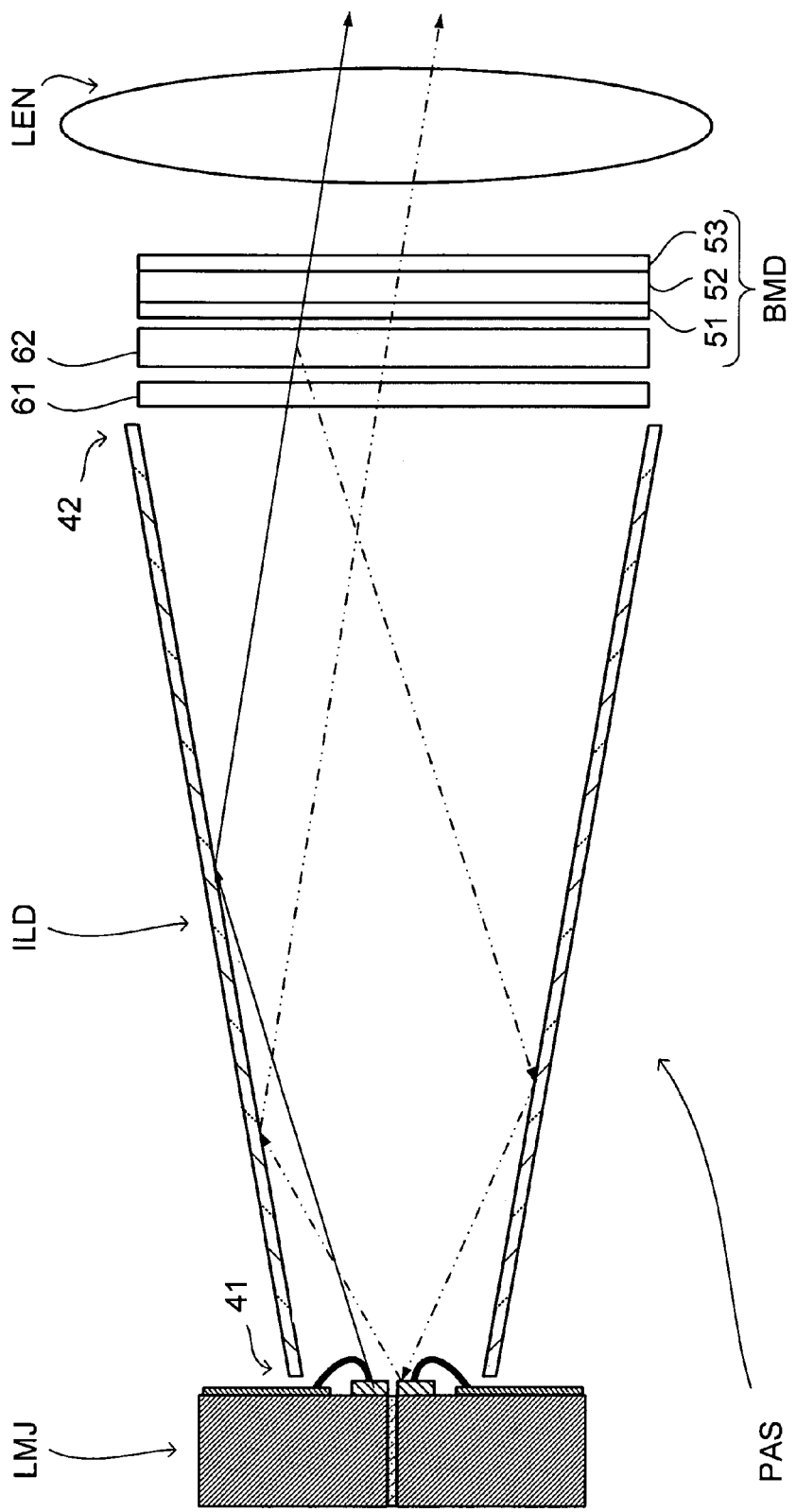
FIG. 9 is a sectional view of an image projection apparatus including a reflective polarizing plate.

As in FIG. 9, when the transmission type liquid crystal device BMD includes, from the light incidence side to the light exit side, an absorption-type polarizing plate (incidence side absorption type polarizing plate) 51, a liquid crystal layer (light modulation layer) 52, and an absorption type polarizing plate (exit side absorption type polarizing plate) 53, a ¼ wave plate 61 and a reflective polarizing plate (conversion type reflective polarizing plate) 62 are arranged between the exit end 42 of the integrator rod ILD and the liquid crystal device BMD in order from the exit end 42 of the integrator rod ILD to the liquid crystal device BMD. The angle in which the ¼ wave plate 61 is oriented tilts at 45 degrees with respect to the transmission axis of the conversion type reflective polarizing plate 62.

Accordingly, light (randomly polarized light) exiting from the integrator rod ILD, alter passing through the ¼ wave plate 61 and then enters the conversion type reflective polarizing plate 62. Thus, the light exiting from the integrator rod ILD is first transformed by the ¼ wave plate 61 into linearly polarized light having a particular polarization direction. Further, the conversion type reflective polarizing plate 62 transmits this linearly polarized light and, on the other hand, reflects linearly polarized light having a vibration surface (polarization surface) vertical to the polarization surface of the aforementioned polarized light.

The linearly polarized light (indicated by a solid line) which has passed through the conversion type reflective polarizing plate 62 directly reaches the liquid crystal device BMD, while the linearly polarized light reflected on the conversion type reflective polarizing plate 62 (indicated by a double-dashed line) is transformed into circularly polarized light as a result of the passage through the ¼ wave plate 61 and then returns to the integrator rod ILD. Consequently, the circularly polarized light is mixed inside the integrator rod ILD and reaches the LED module LMJ. In this case, the circularly polarized light is reflected by the anode 2 or the like located at the bottom of the LED chip 1, returns again to the integrator rod ILD, is mixed, reaches and further passes through the ¼ wave plate 61, and then reaches the conversion type reflective polarizing plate 62.

Note that the light reaching the conversion type reflective polarizing plate 62 is first reflected by the conversion type reflective polarizing plate 62 and then passes (is transmitted) through the ¼ wave plate 61 twice. Thus, the polarization direction of the light first reflected by the conversion type reflective polarizing plate 62 rotates through 90 degrees. That is, the light whose polarization direction permits transmission through the conversion type reflective polarizing plate 62 returns. As a result, the light exiting from the integrator rod ILD reaches the liquid crystal device BMD without being lost and then subjected to light modulation.

As shown in FIG. 10, there is also a transmissive liquid crystal device BMD having not an absorption type polarizing plate but a reflective polarizing plate (incidence side reflective polarizing plate) 54 provided on the incidence side of the liquid crystal layer 52, (and having a transmissive polarizing plate (exit side absorption type polarizing plate) 55 provided on the exit side thereof}. Even in this case, the light exiting from the integrator rod ILD can reach the liquid crystal device BMD without being lost and then can be subjected to light modulation.

For example, between the exit end 42 of the integrator rod ILD and the liquid crystal device BMD, the ¼ wave plate 61 may be arranged. The angle in which the ¼ wave plate 61 is oriented tilts through 45 degrees with respect to the transmission axis of the incidence side reflective polarizing plate 54.

Accordingly, light exiting from the integrator rod ILD (randomly polarized light), after passing through the ¼ wave plate 61, enters the incidence side reflective polarizing plate 54 of the liquid crystal device BMD. Thus, the light exiting from the integrator rod ILD is transformed by the ¼ wave plate 61 into linearly polarized light having a particular polarization direction. Further, the incidence side reflective polarizing plate 54 transmits this linearly polarized light and, on the other hand, reflects linearly polarized light having a vibration surface vertical to the polarization surface of the aforementioned linearly polarized light.

The linearly polarized light which has passed through the incidence side reflective polarizing plate 54 (indicated by a solid line) passes directly through the liquid crystal device BMD, while the linearly polarized light (indicated by the double-dashed line) which has been reflected by the incidence side reflective polarizing plate 54 is transformed into circularly polarized light as a result of the passage through the ¼ wave plate 61 and returns to the integrator rod ILD. Consequently, the circularly polarized light, as in FIG. 9, is mixed in the integrator rod ILD, reaches the LED module LMJ, is reflected by the anode 2 or the like located at the bottom of the LED chip 1, and returns again to the integrator rod ILD. Thus, the circularly polarized light, after mixed, reaches and further passes through the ¼ wave plate 61, and then reaches the incidence side reflective polarizing plate 54.

The light which has reached the incidence side reflective polarizing plate 54, after reflected by the incidence side reflective polarizing plate 54, passes through (is transmitted through) the ¼ wave plate 61 twice, which is equivalent to a phenomenon that the light is, as a result of reciprocation, transmitted through a ½ wave plate having an optical axis at 45 degrees with respect to the light polarization direction. Thus, the polarization direction of the light first reflected by the incidence side reflective polarizing plate 54 rotates through 90 degrees. That is, light whose polarization direction permits transmission through the incidence side reflective polarizing plate 54 returns. As a result, in FIG. 10 as in FIG. 9, the light exiting from the integrator rod ILD reaches the liquid crystal device BMD without being lost and is then subjected to light modulation.

That is, it is preferable to provide a reflective polarization plate which, by having a transmission axis which permits transmission of only light traveling in a particular direction, guides light traveling in the particular direction to the transmissive liquid crystal device BMD and reflects light traveling in other directions (for example, a direction vertical to the particular direction), because, for example when a reflective polarizing plate is arranged somewhere between the transmissive liquid crystal device BMD and the LED module LMJ, polarized light unnecessary for liquid crystal display is reflected and thereby returns to the integrator rod ILD, and further travels to the LED module LMJ side.

Further, success of the LED module LMJ in reflecting light directs this reflected light again to the liquid crystal device BMD. Thus, it is desirable that the ¼ wave plate 61 (phase plate) be provided which transmits light reflected by the reflective polarizing plate and traveling in the direction vertical to the particular direction and then guides the light to the integrator rod ILD.

The reason for providing the ¼ wave plate 61 is as follows. Arranging the ¼ wave plate 61 between the LED module LMJ and the reflective polarizing plate so that the light polarization direction rotates through 90 degrees before the light, which has been reflected by the reflective polarizing plate, returns again to this polarizing plate (during reciprocation) permits reuse of the returning light as a polarization component required for liquid crystal display. Therefore, no loss of illumination light occurs, thus improving the light use efficiency.

For a transmissive liquid crystal device BMD as described above, an optical member such as a polarized beam splitter or the like required for a reflective liquid crystal device is no longer required between the liquid crystal device BMD and the projector lens LEN. Thus, the interval (lens back) between the liquid crystal device BMD and the projector lens LEN is narrow, thus achieving a small-size image projection apparatus PAS.

As an example of the transmissive crystal device BMD, a transmissive liquid crystal device of a sapphire substrate is preferable. An electrode built on sapphire generally can be so formed as to have higher electrical conductivity than that built on glass and have a thinner wiring size than a liquid crystal device having an electrode arranged on glass. This therefore permits a larger aperture ratio of the transmissive liquid crystal device, thus achieving a relatively bright liquid crystal device BMD.

Examples of the reflective polarizing plate include RDF-C (trade name) manufactured by Sumitomo 3M Co. Ltd. and MicroWire (trade name) manufactured by MOXTEK Corporation.

[Other Embodiments]

The present invention is not limited to the embodiments described above, and various modifications can be made within the range not departing from the spirit of the invention.

[1. Modified Example of the LED Module]

Figure 11A:
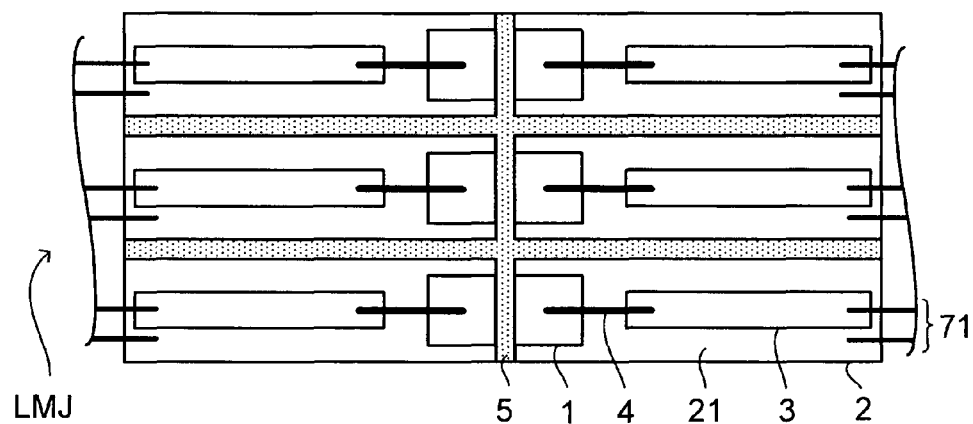
FIG. 11A is a plan view showing an LED module (LED module having six LEDs) different from that of FIG. 1.
Figure 11B:
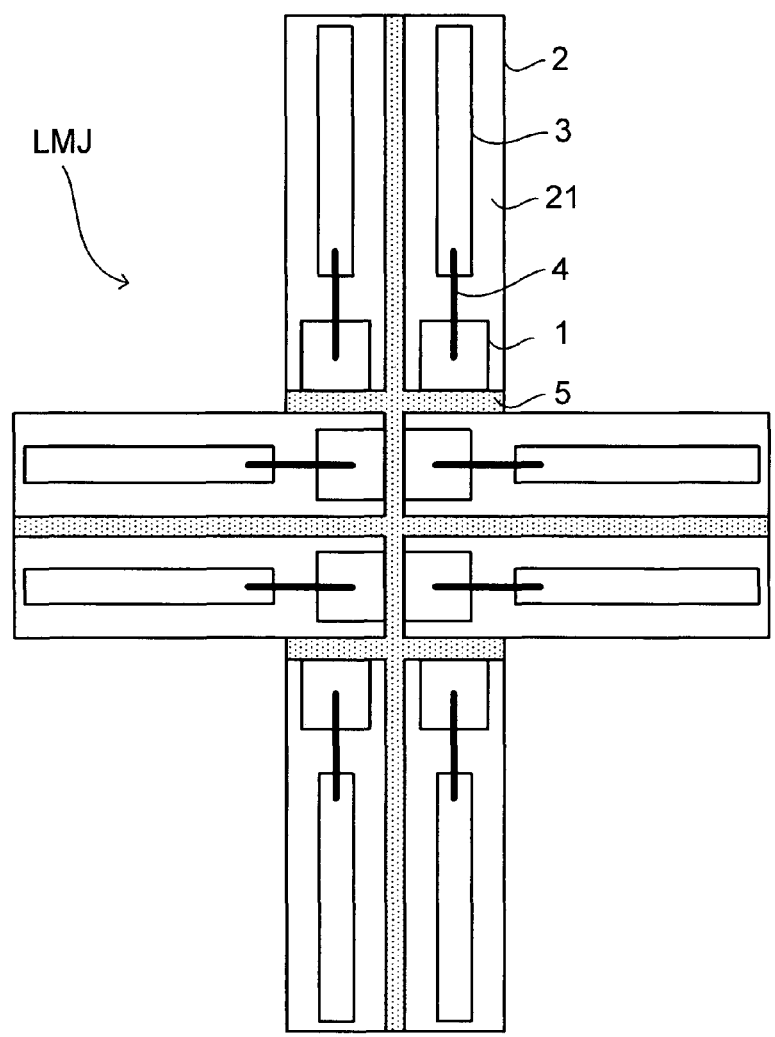
FIG. 11B is a plan view showing an LED module (LED module having eight LEDs) different from that of FIG. 1.

For example, the number of LEDs 9 in the LED module LMJ is not limited to four, and thus may be, for example, 6 or 8 as shown in FIGS. 11A and 11B.

It is preferable that, as shown in FIGS. 1 and 11A, the longer direction of the support surface 21 of the anode 2 and the longer direction of the cathode 3 (in the longer direction in the plane parallel to the support surface 21) be equal to each other. This is because each of the LEDs 9 is connected to a power supply part, not shown, and if the longer direction of the support surface 21 of the anode 2 and the longer direction of the cathode 3 are equal to each other, a connection part 71 linking together the anode 2 and the cathode 3 with the power supply part are oriented in the same direction, which permits easy connection.

In FIGS. 1 and 11A, the planes of the largest extending surfaces 22M of the anodes 2 in the respective LEDs 9 are all in parallel. On the other hand, in FIG. 11B, the planes of the largest extending surfaces 22M of each of two sets of the four divided LEDs 9 are in parallel. That is, there are two sets of LEDs 9 in combination having planes of the largest extending surfaces 22M in parallel (in FIGS. 1 and 11A, there is one set of the LEDs 9 in combination).

However, in the plurality of LEDs 9, with a combination in which the in-surface directions of the largest extending surfaces 22M of the LEDs 9 are in parallel, wind such as provided by the fan FAN or the like is easily directed along the LED 9 in this combination, thus improving the heat dissipation property of the LED chip 1 (and thus the LED module LMJ).

The combination (set) may be, as in FIGS. 1 and 11A, a set composed of all the LEDs 9 in the LED module LMJ, or as in FIG. 11B, sets divided into two from the eight LEDs 9. For example, the LED module LMJ may have eight. LEDs 9, three of which form a set and the remaining five of which form no set (that is, the remaining five largest extending surfaces have mutually different planes). That is, the presence of LEDs 9 whose planes of the maximum extending surfaces 22M of the anodes 2 are matched together (that is, if they are provided in a set) improves the heat dissipation property in the LED module LMJ to no small degree.

More specifically, in a case of the LED module LMJ as in FIG. 11B, if the fan FAN blows or suctions air in the direction parallel to the paper surface, there exist the maximum extending surface 22M extending along the travel direction of the wind and the maximum extending surface 22M opposing this maximum extending surface 22M. However, the heat dissipation property in the LED module LMJ improves when there is at least a maximum extending surface 22M extending along the wind than when there is no such a maximum extending surface 22M.

Needless to say, in a case of the LED module LMJ as in FIG. 11B, if the fan FAN blows or suctions air in the direction parallel to the paper surface, all the maximum extending surfaces 22M extend along the wind, which is the most preferable.

Figure 12A:
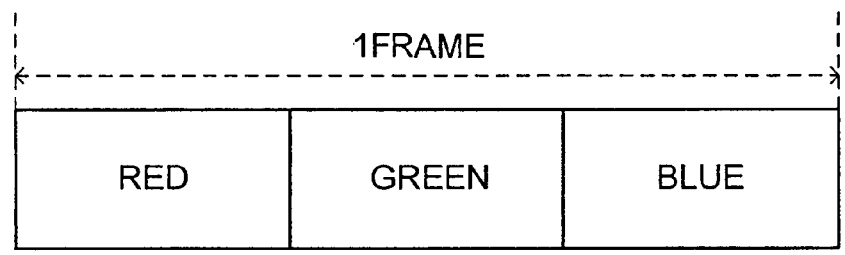
FIG. 12A is a diagram explaining time-shared driving in the LED module (time shared driving in which any one color is not superimposed on another)
Figure 12B:
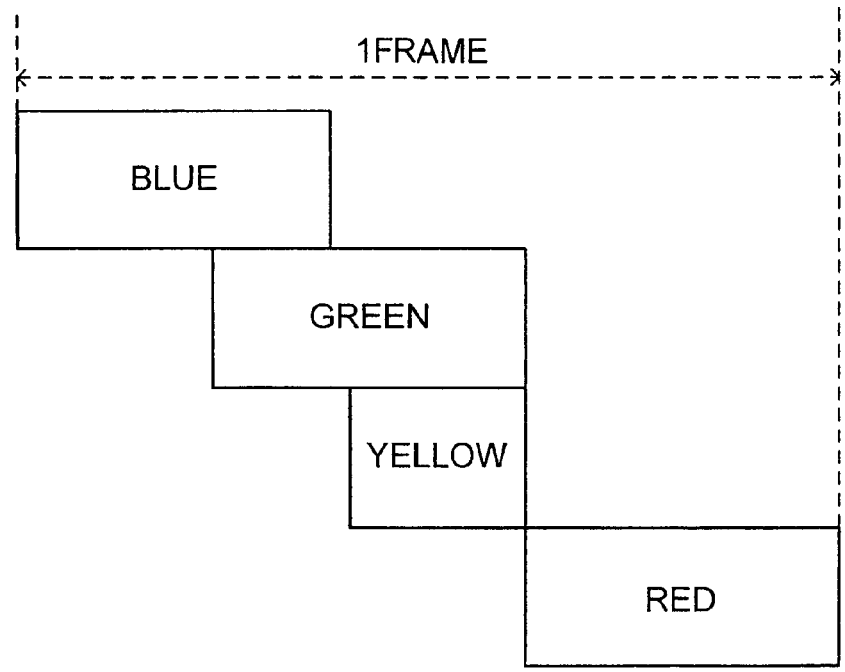
FIG. 12B is a diagram explaining time-shared driving in the LED module (time shared driving in which the colors are partially superimposed on each other)

It is preferable that the LED module LMJ include LEDs 9 emitting light of at least three colors including red, green, and blue, respectively, and that the LED 9s of the respective colors emit light in a time-shared manner. For example, when the LEDs 9 of red, green, and blue colors are lit up in this order in 1 frame (1/30 second) in a time-shared manner as shown in FIG. 12A or when the LEDs 9 are lit up in a time-shared manner such that different colors are partially superposed on each other as shown in FIG. 12B, there exists some LEDs 9 which do not perform emission in one frame.

Thus, the LED chip 1 having the non-emitting LED 9 does not generate heat in one frame. For example, when the LED 9 emitting blue light is first driven into emission in one frame shown in FIG. 12B, the other LEDs 9 emitting green, yellow, and red light are not driven into emission, so that the LED chip 1 is not heated. Moreover, the LEDs 9 are so arranged as to separate from each other; therefore, heat of the LED chip 1 emitting light is not conducted to the non-emitting LED chip 1, thus preventing an increase in the junction temperature.

That is, unlike in the LED module LMJ having a plurality of LED chips 1 on the same substrate, in the LED module LMJ having the LEDs 9 arranged separately from each other, heat conduction does not occur between the LED chips 1 of the LEDs 9. Moreover, the LED module LMJ which emits light in a time-shared manner, unlike an LED module having a plurality of LED chips 1 emitting light all the time (for example, an LED module loaded in an image projection apparatus using a color filter type liquid crystal device), reliably prevents heat conduction between the LED chips 1.

The LED module LMJ having LEDs 9 emitting light of at least three colors: red, green, and blue, respectively, as described above can generate various colors including white. Thus, the image projection apparatus PAS provided with such an LED module LMJ requires no optical member for color synthesis, such as a dichroic prism, a dichroic mirror, and the like.

Figure 13A:
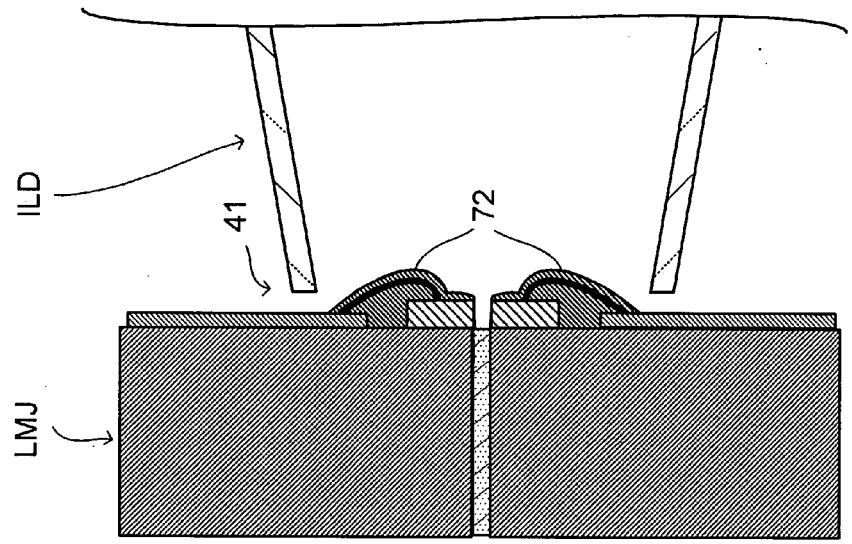
FIG. 13A is a sectional view of the LED module whose the LED chip is coated.
Figure 13B:
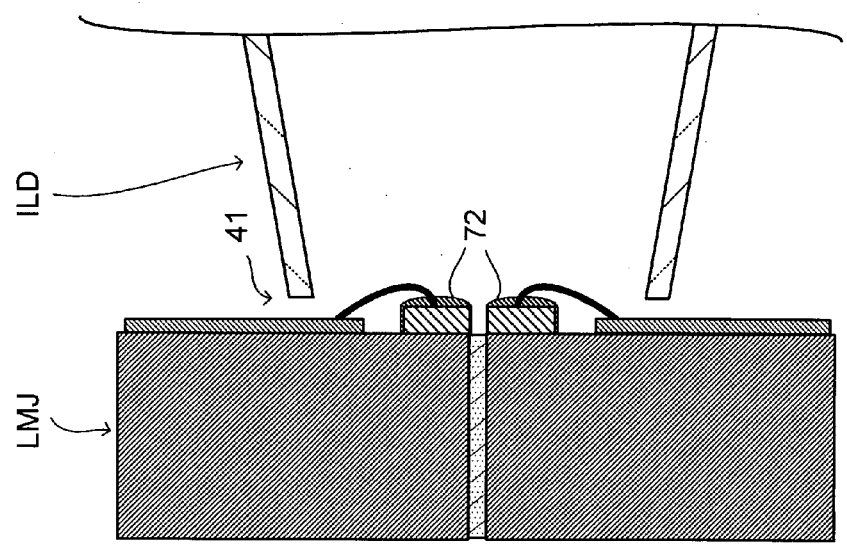
FIG. 13B is a sectional view of the LED module whose the LED chip and wire are coated.

The LED chip 1 in the LED module LMJ is likely to be oxidized. Moreover, the wire 4 linking together the LED chip 1 and the cathode 3 is made of a material, such as gold or the like, which is easy to break. Thus, from a viewpoint of preventing the oxidization of the LED chip 1, it is preferable that such transparent resin (epoxy resin, silicon, or the like) 72 that covers at least the LED chip 1 be coated as shown in FIG. 13A. Moreover, from a viewpoint of preventing the breakage of the wire 4, it is preferable that such transparent resin 7.2 that covers the LED chip 1 and the wire 4 together be coated as shown in FIG. 13B.

For coating, the LED chip 1 or the like of each LED 9 may be coated individually, or the LED chips 1 of the plurality of LEDs 9 may be coated together.

Such transparent resin 72 for coating is formed with a film thickness of approximately 0.1 mm so that light emission by the LED chip 1 is not interfered. Furthermore, the transparent resin is effective in improving the refractive index around the LED chip 1 and thus improving the light extraction efficiency.

Coupling of the LED chip 1 with the anode 2, and the like have been described above, although not limited thereto. That is, the cathode may support the LED chip and the anode may be fitted to the support surface of the cathode supporting the LED chip and linked to the LED chip via a wire. In short, the direction of current in the LED 9 may be reversed.

The driving current of the LED 9 is 100 mA or more. The LED 9 driven in such a current range is called a power LED capable of ensuring a brightness of several tens of lumens (lm) to one hundred lumens or more. Thus, heat is likely to be generated in the LED chip 1. However, the aforementioned LED module LMJ is capable of sufficiently dissipate heat of even the LED chip 1 heated.

In the event of excessively high current flow, which leads to problems such as heat generation and upsizing of a current circuit, the driving current of the LED 9 is desirably 5A or less, that is, between 100 mA inclusive and 5A inclusive, but preferably in the range between 0.5 mA inclusive and 3A inclusive.

[2. Modified Example of the Integrator Rod ILD]

The shape of the incidence end 41 and the exit end 42 of the integrator rod ILD is, for example, rectangular, although not specifically limited thereto. However, an image surface (screen surface) SCN of a typical image projection apparatus PAS is, as in FIG. 14A, rectangular.

Accordingly, it is preferable that the shape of the exit end 42 of the integrator rod ILD which projects image light on the screen surface SCN be a similar rectangle. Further, it is preferable that the shape of the incidence end 41 of the integrator rod ILD be a rectangle similar to that of the exit end 42. However, the ratio (AQ/AP) between the area (AP) of the incidence end 41 of the integrator rod ILD and the area (AQ) of the exit end 42 thereof relates to the directivity of light exiting from the integrator rod ILD, as described in the conditional formula D.

From a viewpoint of downsizing the image projection apparatus PAS, it is preferable that the incidence end 41 be reduced without increasing the area of the exit end 42 of the integrator rod ILD, although the incidence end 41 of the integrator rod ILD needs to have such an area that permit reception of all light from the LED chip 1.

Thus, as in FIG. 14B or FIG. 14C, setting of the area of the incidence end 41 can be considered. FIGS. 14B and 14C are based on the assumption that the integrator rod ILD is hollow. Thus, as shown in FIGS. 15 and 16, the aperture of the incidence end 41 of the integrator rod ILD is so sized as to cover the LED chip 1 and the wire 4. Chain doule-dashed lines in FIGS. 14B and 14C indicate the size (aperture size) of the incidence end 41 of the integrator rod ILD similar to the screen surface SCN.

In FIG. 14B, the shorter direction of the aperture size is parallel to the direction in which the wire 4 extends. On the other hand, in FIG. 14C, the shorter direction of the aperture size is vertical to the direction in which the wire 4 extends. Thus, when ensuring the aperture size of the incidence end 41 of the integrator rod ILD similar to the same screen surface SCN, the area in FIG. 14C is narrower than the area in FIG. 14B.

That is, when the wire 4 required for electrical connection to the LED chip 1 is provided, an outer peripheral region (that is, region indicated by a chain doule-dashed line in FIG. 14C) is defined which is outer periphery surrounding all the light emission surfaces 11 of the LED chips 1 and all the wires 4 in the plurality of LEDs 9 and which is formed with the shortest outer peripheral length. If the shorter direction of this outer peripheral region (coated region) can be defined, it is preferable that the incidence end 41 of the integrator rod ILD is so formed as to have a shorter direction equal to the shorter direction of the outer peripheral region.

This results in the incidence end 41 of the integrator rod ILD having a relatively narrow area even if this incidence end 41 of the integrator rod ILD is such as to cover the same coated area. That is, the area (that is, the region indicated by the chain doule-dashed line of FIG. 14C) of the aperture size so formed as to have a shorter direction parallel to the shorter direction of the outer peripheral region is narrower than the area (that is, the region indicated by a chain doule-dashed line of FIG. 14B) of the aperture size so formed as to have a shorter direction vertical to the shorter direction of the outer peripheral region.

Consequently, this image projection apparatus PAS can be downsized by reducing the area of the incidence end 41 of the integrator rod ILD without increasing the area of the exit end 42 thereof, which further permits appropriately setting the directivity.

[3. Examples]

Hereinafter, numerical examples 1 to 4 (EX 1 to EX4) of the LED module LMJ, lighting apparatus LAS, and image projection apparatus PAS described above are provided.

[3-1. LED Module]

Table 1 shows, for colors of light emitted by the respective LED chips 1 in the LED module LMJ, sizes of one LED chip 1 (L1, L2, and L3), the light emission area (AL) of all the LED chips 1 in the LED module LMJ, sizes of the anode 2 (E1, E2, and E3), space between the anodes 2 (D), and an area (AR) of a region which is outer periphery surrounding the all the light emission surfaces 11 of the LED chips 1 in the LED module LMJ and which is defined by the shortest outer peripheral length. The permitted current value of the LED chip 1 is 1.5A, in which case voltage is approximately 3V.

[3-2. Integrator Rod]

Table 2 shows sizes and areas of the incidence end 41 (P1, P2, and AP) and the sizes and areas of the exit end 42 (Q1, Q2, and AQ), and overall lengths (R) in the integrator rod ILD.

[3-3. Light Modulation Device and Projector Lens]

Table 3 shows space between the integrator rod ILD and the light modulation device BMD (G), sizes and areas (M1, M2, and AM) of a modulation surface of the light modulation device BMD, F no. of the projector lens LEN.

[4. Results of Conditional Formulae]

Tables 4 to 9 respectively show the results of the conditional formulae A to F described above each in correspondence with Examples 1 to 4.

[5. Modified Example of the LED Chip 1 and the LED]

Figure 18A:
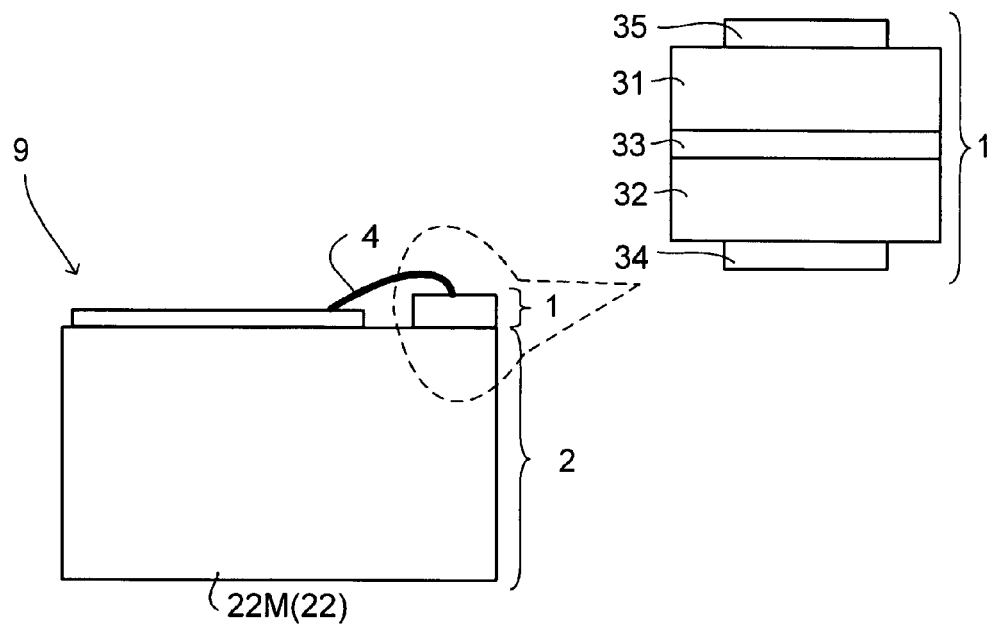
FIG. 18A is a sectional view of an LED and an enlarged view of an LED chip loaded in the LED.

The LED chip 1, as shown in an enlarged portion of FIG. 18A, includes: a light emission layer 31, a substrate layer 32, a reflection layer 33, and a first electrode pad 34 and a second electrode pad 35 for flowing making current through the light emission layer 31 (the electrode connected to the anode 2 is referred to as the first electrode pad 34 and the electrode connected to the cathode 3 is referred to as the second electrode pad 35).

The light emission layer 31 is formed of a semiconductor emitting light by making current; it is formed of, for example, InGaN for blue light and green light emission and InGaAlP for red light and yellow light emission.

The substrate layer 32 is formed of a material having holding function of holding the light emission layer 31 and heat dissipation function of releasing heat caused by the current, for example, an insulator such as $Al_2O_3$ (sapphire), a semiconductor such as SiC, Si, Ge, SiN, GaN, or GaAs, or metal.

The reflection layer 33 reflects light, which has been emitted in all directions within the plane of the light emission layer 31, toward a desired direction, and formed of a metal thin film having conductivity, such as Au (gold), Al (aluminum), or the like.

It is preferable that the LED chip 1 having the layers as described above have the light emission layer 31, the substrate layer 32, and the reflection layer 33 so located as to lie between the first electrode pad 34 and the second electrode pad 35. However, various assumption can be made for arrangements of the light emission layer 31, the substrate layer 32, and the reflection layer 33 located between the first electrode pad 34 and the second electrode pad 35.

Figure 18B:
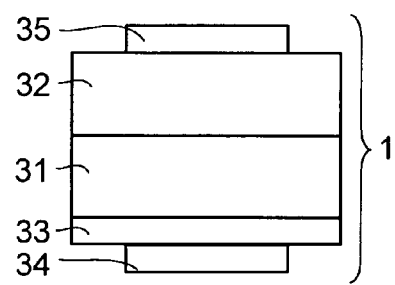
FIG. 18B is an enlarged view of an LED chip different from that of FIG. 18A.

For example, as shown in the enlarged portion of FIG. 18A, there is arrangement in which the substrate layer 32, the reflection layer 33, and the light emission layer 31 are laid in this order from the first electrode pad 34 toward the second electrode pad 35. As shown in FIG. 18B, there may also be arrangement in which the reflection layer 33, the light emission layer 31, and the substrate layer 32 are laid in this order from the first electrode pad 34 toward the second electrode pad 35.

In short, as long as the reflection layer 33 lies between the light emission layer 31 and the anode 2 supporting the LED chip 1, any arrangement is permitted, because with this arrangement, light emitted from the light emission layer 31 is radiated hemispherically by the reflection layer 33 and thus does not reach the anode 2 (note that even the LED chip 1 not including a reflection layer may fulfill function as the LED 9 when light is emitted from the light emission layer 31).

Various assumptions can be made for connection between the LED chip 1 and the anode 2. For example, as in FIG. 19A, the reflection layer 33 of the LED chip 1 provided with the first electrode pad 34 arranged on one piece of the two divided light emission layers 31 (31A and 31B) and with the second electrode pad 35 arranged on another piece thereof may be bonded together with the anode 2 with an adhesive BR (for example, an adhesive containing thermally conductive grease) in between. For such a LED chip 1 (a sapphire layer as the insulator of the substrate layer 32), for the purpose of current flow through the light emission layer 31, a wire 4 connecting together the first electrode pad 34 and the anode 2 and a wire 4 connecting together the second electrode pad 35 and the cathode 3 are required.

An increase in the number of wires 4 as described above involves an increase in the danger of disconnecting the wires 4 accordingly. The increase in the number of wires 4 also requires ensuring space in accordance with this number, thus upsizing the LED 9. Consequently, as in FIGS. 18A and 18B, the first electrode pad 34 and the second electrode pad 35 are desirably arranged in such a manner as to sandwich the light emission layer 31, the substrate layer 32, and the reflection layer 33.

Such arrangement permits, for example, connection of the first electrode pad 34 and the anode 2 without any wire, thus permitting reliably reducing the number of wires 4. Moreover, the firm connection between the first electrode pad 34 and the anode 2 without any wires stabilizes the conductivity and also physical connection.

In the case of arrangement such that the first electrode pad 34 and the second electrode pad 35 sandwich the light emission layer 31, the substrate layer 32, and the reflection layer 33, in order to ensure the conductivity between the second electrode pad 35 and the first electrode pad 34, all the layers desirably have conductivity. Therefore, it is preferable that a material of the substrate layer 32 be a semiconductor of SiC, Si, Ge, SiN, GaN, or GaAs, or a conductor of metal or the like.

Further, such a material with highly electrical conductivity also has excellent heat dissipation property. For example, the thermal conductivity of SiC as a semiconductor is 490 W/m·K and the thermal conductivity of $Al_2O_3$ as an insulator is 42 W/m·K; therefore, the substrate layer 32 of SiC has ten or more times as excellent heat dissipation property as the substrate layer 32 of $Al_2O_3$.

Figure 19B:
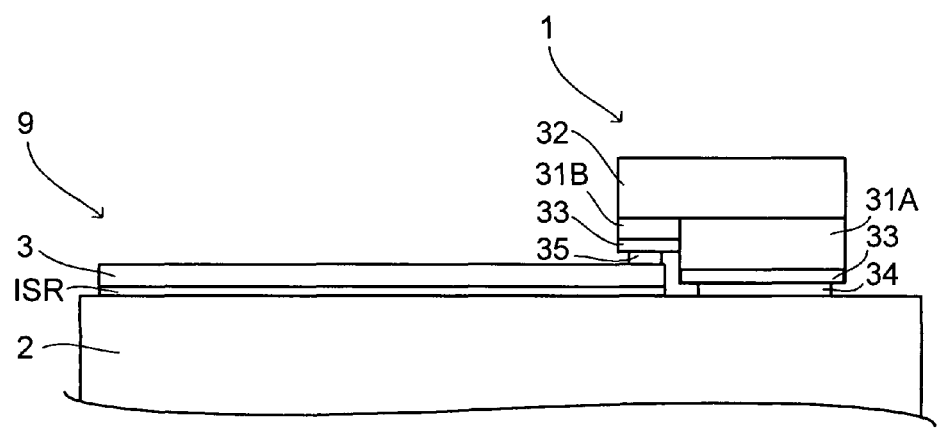
FIG. 19B is a side view of an LED different from that of FIG. 19A.

As an LED 9 using no wires, there is one, as shown in FIG. 19B, having: the first electrode pad 34 provided on one piece of the two divided light emission layers 31 (31A and 31B) and fitted to the anode 2 and having the second electrode pad 35 provided on another piece thereof and fitted to the cathode 3. For connection of the first electrode pad 34 and the second electrode pad 35 provided in the LED 9 with the anode 2 and the cathode 3, a conductive adhesive or a eutectic crystal may be used.

Now, detained description will be given for the conductive adhesive BR and the eutectic crystal which can be used for the connection between the LED chip 1 and the anode 2 shown in FIG. 19B and FIG. 18A. Examples of the conductive adhesive BR include a silver paste BR. Such silver paste (heat conductive silver paste) BR is excellent not only in the conductivity but also in the thermal conductivity.

For example, the thermal conductivity of silicon-based thermally conductive grease is 2 to 4 W/m·K while the thermal conductivity of the silver paste BR is 20 to 30 W/m·K. Thus, connecting the LED chip 1 to the anode 2 by using the silver paste BR causes heat of the LED chip 1 to be conducted to the anode 2 via the silver paste BR, thus achieving efficient heat dissipation.

The conductive adhesive BR is not limited to the silver paste BR but may be, for example, gold paste, copper paste, aluminum paste, silicon paste, or the like. These pastes, like the silver paste BR, includes metal which is excellent not only in the conductivity but also in the thermal conductivity (see the following).

| | |
|---|---|
| Silver (Ag) | 420 W/m · K |
| Gold (Au) | 320 W/m · K |
| Copper (Cu) | 390 W/m · K |
| Aluminium (Al) | 236 W/m · K |
| Silicon (Si) | 168 W/m · K |

Next, the eutectic crystal will be described. The eutectic crystal is a mixture of two kinds of materials simultaneously crystallized (solidified) with a fixed ratio from given molten metal. In the eutectic crystal, the two kinds of materials are not simply mixed together, but binding force is generated between crystal grains in the two materials. Thus, bonding (connection) achieved by using the eutectic crystal is extremely firm.

The eutectic crystal is also a phenomenon occurring between particular metals, and examples of a combination creating the eutectic crystal includes Au and Sn (tin), Au and Si, Au and Ge (germanium), Pb (lead) and Sn, Ag and Cu, and Ag and Sn. Such a eutectic crystal is obtained by bringing two kinds of metal into contact with each other and adding heat or pressure thereto. However, the added heat is lower than the melting point of individual metal (see the melting point of Au in Table 10). Thus, only the portion where two kinds of metal are in contact with each other is formed into a eutectic crystal, and the remaining portion is not influenced by the heat.

Figure 20A:
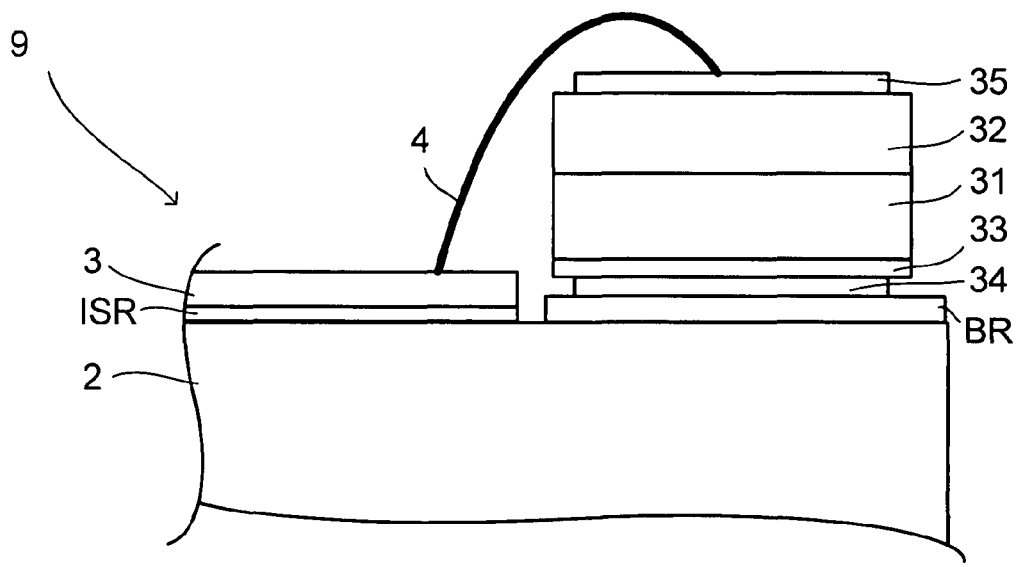
FIG. 20A is a side view showing a eutectic crystal included in the LED.
Figure 20B:
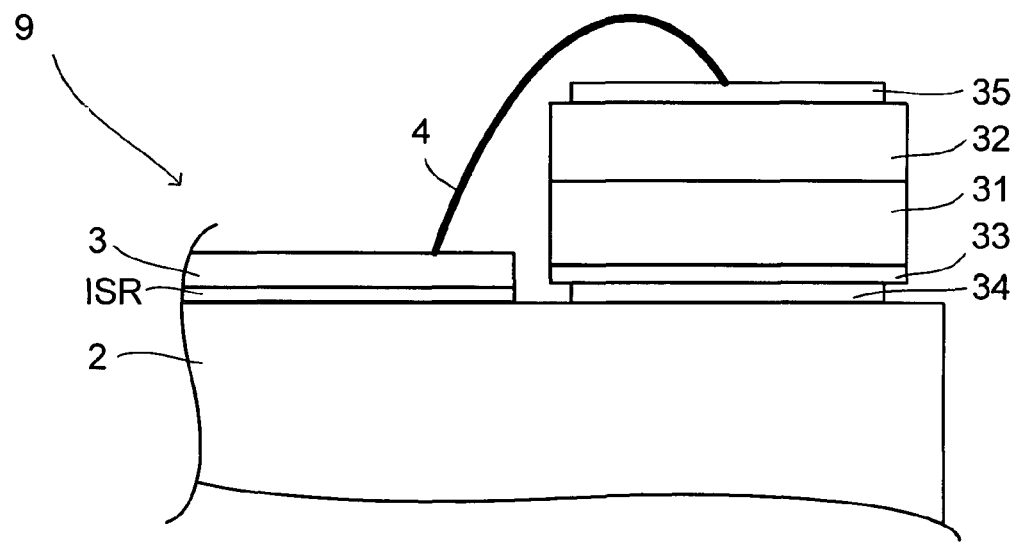
FIG. 20B is a side view showing a eutectic crystal different from that of FIG. 20A.
Figure 22:
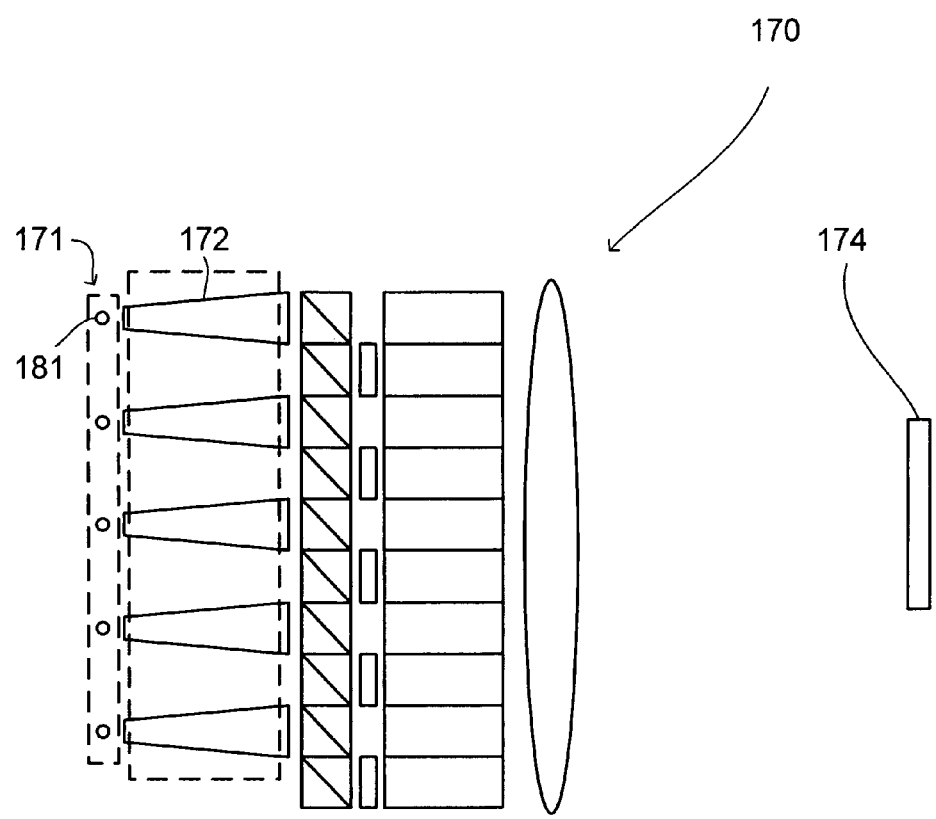
FIG. 22 is an explanatory diagram showing a conventional lighting apparatus different from that of FIGS. 21A and 21B.

FIGS. 20A and 20B show the connection between the LED chip 1 and the anode 2 by using the eutectic crystal. FIG. 20A shows the LED 9 having the first electrode pad 34 of AuSn and the anode 2 of Cu bonded together via the silver paste BR. In such a case, a eutectic crystal of Sn and Ag is created at the interface between the first electrode pad 34 and the silver paste BR, and a eutectic crystal of Cu and Ag is created at the interface between the anode 2 and the silver paste BR. Thus, the presence of such a eutectic crystal results in an LED 9 in which the LED chip 1 having the first electrode pad 34 and the anode 2 are firmly connected together.

For the LED 9 using the silver paste BR as in FIG. 20A, a eutectic crystal may not be formed in accordance with the proportion between Ag and Sn, the proportion between Ag and Cu, and further heat or pressure added. However, even when no eutectic crystal is formed, the use of the silver paste BR ensures the connection between the LED chip 1 and the first lead electrode 2.

On the other hand, FIG. 20B shows the LED 9 having the first electrode pad 34 of AuSn and the anode 2 of Cu bonded together without the silver paste BR. In such a case, a eutectic crystal of Sn and Cn is created at the interface between the first electrode pad 34 and the anode 2. Thus, even without the use of the silver paste, the eutectic crystal formed of Sn and Cu results in an LED 9 in which the LED chip 1 having the first electrode pad 34 and the anode 2 are firmly connected together.

Furthermore, a eutectic crystal included in the LED 9 as described above contains a material (gold, silver, copper, or the like) with excellent thermal conductivity, and thus has more excellent heat thermal conductivity than thermally conductive grease and the like. Therefore, in such an LED 9, heat of the LED chip 1 is conducted to the anode 2 via the eutectic crystal, thus achieving efficient heat dissipation.

According to the light emitting device of the above-mentioned embodiments, the fixed first lead electrode of the light emitting chip also serves as a heat dissipater, which permits the light emitting chip to be quickly cooled down (prevention of an increase in the junction temperature. Typically, the optical power (brightness) proportional to the current amount can be provided until the junction temperature can be kept constant, but when the junction temperature becomes high, the making current added turns into heat.

Therefore, performing effective heat dissipation as performed by the light emitting device of the present invention can provide a relatively large current which permits the junction temperature to be kept constant. As a result, brightness proportional to the making current can be provided, thus achieving a high-luminance light emitting module. Moreover, this light emitting module is not of, for example, a type having a light emitting chip on a substrate, and thus is small-sized.

Detailed embodiment, examples, or the like described above just clarify the details of technology provided by the invention. Therefore, the invention should not be interpreted in a narrow sense by limiting it to the detailed examples, and thus various modifications can be made within the scope of the appended claims.

TABLE 1

|  | COLOR | LED TIP 1TIP SIZE | | | AREA | LEAD ELECTRODE SIZE | | | SPACE | |
|---|---|---|---|---|---|---|---|---|---|---|
|  |  | L1 (mm) | L2 (mm) | L3 (mm) | AL (mm$^2$) | E1 (mm) | E2 (mm) | E3 (mm) | D (mm) | AR (mm$^2$) |
| EX1 | RED GREEN GREEN BLUE | 0.90 | 0.90 | 0.25 | 3.24 | 1.00 | 5.00 | 3.00 | 0.10 | 3.61 |
| EX2 | RED GREEN BLUE YELLOW | 1.08 | 1.08 | 0.25 | 4.67 | 1.00 | 5.00 | 8.00 | 0.05 | 4.88 |
| EX3 | RED GREEN GREEN BLUE | 0.90 | 1.08 | 0.25 | 3.89 | 1.20 | 10.00 | 5.00 | 0.05 | 4.12 |
| EX4 | RED GREEN BLUE YELLOW | 0.90 | 1.08 | 0.25 | 3.89 | 1.20 | 3.00 | 3.00 | 0.05 | 4.12 |

TABLE 2

|  | INTEGRATOR ROD | | | | | | |
|---|---|---|---|---|---|---|---|
|  | INCIDENCE | | | EJECTION | | | LENGTH |
|  | P1 (mm) | P2 (mm) | AP (mm$^2$) | Q1 (mm) | Q2 (mm) | AQ (mm$^2$) | R (mm) |
| EX1 | 2.20 | 2.20 | 4.84 | 4.00 | 6.00 | 24.00 | 15.00 |
| EX2 | 2.76 | 3.36 | 9.27 | 6.40 | 8.80 | 56.32 | 40.00 |
| EX3 | 2.50 | 2.50 | 6.25 | 6.40 | 8.80 | 56.32 | 30.00 |
| EX4 | 2.50 | 2.50 | 6.25 | 6.40 | 8.80 | 56.32 | 30.00 |

TABLE 3

|  | SPACE | BMD | | | LENS |
|---|---|---|---|---|---|
|  | G (mm) | M1 (mm) | M2 (mm) | AM (mm$^2$) | Fno. |
| EX1 | 0.30 | 4.00 | 6.00 | 24.00 | 1.5 |
| EX2 | 0.20 | 6.20 | 8.80 | 54.56 | 1.8 |
| EX3 | 0.30 | 6.20 | 8.80 | 54.56 | 1.8 |
| EX4 | 0.10 | 6.20 | 8.80 | 54.56 | 1.8 |

TABLE 4

|  | Conditional formulae A E3/Lmax | E3 (mm) | Lmax (mm) |
|---|---|---|---|
| EX1 | 3.333 | 3.00 | 0.90 |
| EX2 | 7.407 | 8.00 | 1.08 |
| EX3 | 4.630 | 5.00 | 1.08 |
| EX4 | 2.778 | 3.00 | 1.08 |

TABLE 5

|  | Conditional formulae B AL/AR | AL (mm$^2$) | AR (mm$^2$) |
|---|---|---|---|
| EX1 | 0.898 | 3.24 | 3.61 |
| EX2 | 0.955 | 4.67 | 4.88 |
| EX3 | 0.943 | 3.89 | 4.12 |
| EX4 | 0.943 | 3.89 | 4.12 |

TABLE 6

|  | Conditional formulae C D/Lmax | D (mm) | Lmax (mm) |
|---|---|---|---|
| EX1 | 0.111 | 0.10 | 0.90 |
| EX2 | 0.046 | 0.05 | 1.08 |
| EX3 | 0.046 | 0.05 | 1.08 |
| EX4 | 0.046 | 0.05 | 1.08 |

TABLE 7

|  | Conditional formulae D AQ/AP | AQ (mm$^2$) | AP (mm$^2$) |
|---|---|---|---|
| EX1 | 4.959 | 24.00 | 4.84 |
| EX2 | 6.073 | 56.32 | 9.27 |
| EX3 | 9.011 | 56.32 | 6.25 |
| EX4 | 9.011 | 56.32 | 6.25 |

TABLE 8

|  | Conditional formulae E AL/AP | AL (mm$^2$) | AP (mm$^2$) |
|---|---|---|---|
| EX1 | 0.669 | 3.24 | 4.84 |
| EX2 | 0.503 | 4.67 | 9.27 |
| EX3 | 0.622 | 3.89 | 6.25 |
| EX4 | 0.622 | 3.89 | 6.25 |

TABLE 9

|  | Conditional formulae F G/Lmax | G (mm) | Lmax (mm) |
|---|---|---|---|
| EX1 | 0.333 | 0.30 | 0.90 |
| EX2 | 0.185 | 0.20 | 1.08 |
| EX3 | 0.278 | 0.30 | 1.08 |
| EX4 | 0.093 | 0.10 | 1.08 |

TABLE 10

| Composition System | Composition (Wt %) | Melting Point(° C.) Solid Phase Point | Liquid Phase Point |
|---|---|---|---|
| Au—Sn | Au/20Sn | 280 (Eutectic) | |
|  | Au/90Sn | 217 (Eutectic) | |
| Au—Si | Au/3.15Si | 363 (Eutectic) | |
|  | Au/2Si | 363 | 760 |
| Au—Ge | Au/12Ge | 356 (Eutectic) | |
|  | Au/7.4Ge | 356 | 680 |
| Au | Au | 1063 | |
| Pb—Sn | Pb/63Sn | 183 (Eutectic) | |
|  | Pb/5Sn | 272 | 314 |

What is claimed is:

1. A light emitting module arranging therein a plurality of light emitting devices, each light emitting device including:
   a light emitting chip;
   a first lead electrode linked to the light emitting chip, the first lead electrode having: a support surface supporting the light emitting chip; and an extending part extending with respect the support surface, the extending parts in the plurality of light emitting devices separating from each other;
   an insulator layer mounted on to the support surface of the first lead electrode; and
   a second lead electrode having a potential polarity opposite to a potential polarity of the first lead electrode, the second lead electrode being arranged on the insulator layer and being electrically connected to the light emitting chip;
   wherein, in the plurality of light emitting devices, an insulator lies is positioned in at least part of a space between the extending parts.

2. The light emitting module according to claim 1, wherein extending surfaces as surfaces of the extending part include a surface having a wider area than the support surface.

3. The light emitting module according to claim 1, wherein conditional formula (1) is fulfilled:

$$1.0 < E3/Lmax < 10.0 \quad \text{Conditional formula (1)},$$

where
   E3: denotes a length of the first lead electrode in a direction along an optical axis direction of light from the light emitting chip; and
   Lmax: denotes a longest length at an outer edge end of the light emission surface of the light emitting chip.

4. The light emitting module according to claim 1, wherein, let a surface, of extending surfaces as surfaces of the extending part, having a largest area be called the largest extending surface, there exists a combination of the light emitting devices whose planes of the largest extending surfaces are in parallel.

5. The light emitting module according to claim 1, wherein a longer direction of the support surface of the first lead electrode and a longer direction of the second lead electrode are equal to each other.

6. The light emitting module according to claim 1, wherein a driving current of the light emitting device is between 100 mA inclusive and 5A inclusive.

7. The light emitting module according to claim 1, wherein conditional formulae (2) and (3) below are fulfilled:

$$0.7 < AL/AR < 0.98 \quad \text{Conditional formula (2)},$$

where
- AL: denotes a light emission area of all the light emitting chips in the plurality of light emitting devices; and
- AR: denotes an area of a region which is outer periphery surrounding the light emission surfaces of all the light emitting chips in the plurality of light emitting devices and which is defined by a shortest outer peripheral length, and $$0.01 < D/Lmax < 0.5 \quad \text{Conditional formula (3),}$$

where
- D: denotes a length of an interval between the first lead electrodes in the plurality of light emitting devices; and
- Lmax: denotes a longest length at an outer edge end of the light emission surface of the light emitting chip.

8. A light emitting module arranging therein a plurality of light emitting devices, each light emitting device including:
- a light emitting chip;
- a first lead electrode linked to the light emitting chip, the first lead electrode having: a support surface supporting the light emitting chip; and an extending part extending with respect the support surface, the extending parts in the plurality of light emitting devices separating from each other;
- an insulator layer mounted on to the support surface of the first lead electrode; and
- a second lead electrode having a potential polarity opposite to a potential polarity of the first lead electrode, the second lead electrode being arranged on the insulator layer and being electrically connected to the light emitting chip, wherein conditional formulae (2) and (3) below are fulfilled:

$$0.7 < AL/AR < 0.98 \quad \text{Conditional formula (2),}$$

where
- AL: denotes a light emission area of all the light emitting chips in the plurality of light emitting devices; and
- AR: denotes an area of a region which is outer periphery surrounding the light emission surfaces of all the light emitting chips in the plurality of light emitting devices and which is defined by a shortest outer peripheral length, and $$0.01 < D/Lmax < 0.5 \quad \text{Conditional formula (3),}$$

where
- D: denotes a length of an interval between the first lead electrodes in the plurality of light emitting devices; and
- Lmax: denotes a longest length at an outer edge end of the light emission surface of the light emitting chip.

* * * * *